(12) United States Patent
Shenoy

(10) Patent No.: US 8,518,777 B2
(45) Date of Patent: Aug. 27, 2013

(54) METHOD FOR FORMING ACCUMULATION-MODE FIELD EFFECT TRANSISTOR WITH IMPROVED CURRENT CAPABILITY

(75) Inventor: Praveen Muraleedharan Shenoy, Wilkes Barre, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 13/083,406

(22) Filed: Apr. 8, 2011

(65) Prior Publication Data

US 2012/0178228 A1    Jul. 12, 2012

Related U.S. Application Data

(60) Division of application No. 12/114,575, filed on May 2, 2008, now Pat. No. 7,936,008, which is a continuation of application No. 11/140,249, filed on May 26, 2005, now Pat. No. 7,368,777, which is a continuation-in-part of application No. 11/026,276, filed on Dec. 29, 2004, now Pat. No. 7,345,342.

(60) Provisional application No. 60/588,845, filed on Jul. 15, 2004, provisional application No. 60/669,063, filed on Apr. 6, 2005.

(51) Int. Cl.
*H01L 29/78* (2006.01)
*H01L 29/76* (2006.01)

(52) U.S. Cl.
USPC ........... 438/270; 438/259; 438/274; 257/328; 257/330; 257/332; 257/341; 257/E21.252; 257/E21.345; 257/E29.02; 257/E29.257

(58) Field of Classification Search
USPC ................ 438/259, 270, 274; 257/328, 330, 257/332, 341, E21.252, E21.345, E29.02, 257/E29.257
See application file for complete search history.

(56) References Cited

U.S. PATENT DOCUMENTS 3,404,295 A    10/1968    Warner et al.
3,412,297 A    11/1968    Amlinger
(Continued)

FOREIGN PATENT DOCUMENTS

CN    1036666 A    10/1989
DE    4300806 C1    12/1993
(Continued)

OTHER PUBLICATIONS

Notice of Allowance of Dec. 30, 2010 for U.S. Appl. No. 12/114,575, 6 pages.
(Continued)

*Primary Examiner* — Dao H Nguyen

(57) ABSTRACT

A method of forming an accumulation-mode field effect transistor includes forming a channel region of a first conductivity type in a semiconductor region of the first conductivity type. The channel region may extend from a top surface of the semiconductor region to a first depth within the semiconductor region. The method also includes forming gate trenches in the semiconductor region. The gate trenches may extend from the top surface of the semiconductor region to a second depth within the semiconductor region below the first depth. The method also includes forming a first plurality of silicon regions of a second conductivity type in the semiconductor region such that the first plurality of silicon regions form P-N junctions with the channel region along vertical walls of the first plurality of silicon regions.

14 Claims, 12 Drawing Sheets

(56) References Cited

U.S. PATENT DOCUMENTS

| | | |
|---|---|---|
| 3,497,777 A | 2/1970 | Teszner et al. |
| 3,564,356 A | 2/1971 | Wilson |
| 3,660,697 A | 5/1972 | Berglund et al. |
| 4,003,072 A | 1/1977 | Matsushita et al. |
| 4,011,105 A | 3/1977 | Paivinen et al. |
| 4,300,150 A | 11/1981 | Colak |
| 4,324,038 A | 4/1982 | Chang et al. |
| 4,326,332 A | 4/1982 | Kenney et al. |
| 4,337,474 A | 6/1982 | Yukimoto |
| 4,345,265 A | 8/1982 | Blanchard |
| 4,445,202 A | 4/1984 | Geotze et al. |
| 4,568,958 A | 2/1986 | Baliga |
| 4,579,621 A | 4/1986 | Hine |
| 4,636,281 A | 1/1987 | Buiguez et al. |
| 4,638,344 A | 1/1987 | Cardwell, Jr. |
| 4,639,761 A | 1/1987 | Singer et al. |
| 4,673,962 A | 6/1987 | Chatterjee et al. |
| 4,698,653 A | 10/1987 | Cardwell, Jr. |
| 4,716,126 A | 12/1987 | Cogan |
| 4,745,079 A | 5/1988 | Pfiester |
| 4,746,630 A | 5/1988 | Hui et al. |
| 4,754,310 A | 6/1988 | Coe |
| 4,767,722 A | 8/1988 | Blanchard |
| 4,774,556 A | 9/1988 | Fujii et al. |
| 4,801,986 A | 1/1989 | Chang et al. |
| 4,821,095 A | 4/1989 | Temple |
| 4,823,176 A | 4/1989 | Baliga et al. |
| 4,824,793 A | 4/1989 | Richardson et al. |
| 4,853,345 A | 8/1989 | Himelick |
| 4,868,624 A | 9/1989 | Grung et al. |
| 4,893,160 A | 1/1990 | Blanchard |
| 4,903,189 A | 2/1990 | Ngo et al. |
| 4,914,058 A | 4/1990 | Blanchard |
| 4,941,026 A | 7/1990 | Temple |
| 4,961,100 A | 10/1990 | Baliga et al. |
| 4,967,245 A | 10/1990 | Cogan et al. |
| 4,969,028 A | 11/1990 | Baliga |
| 4,974,059 A | 11/1990 | Kinzer |
| 4,990,463 A | 2/1991 | Mori |
| 4,992,390 A | 2/1991 | Chang |
| 5,027,180 A | 6/1991 | Nishizawa et al. |
| 5,034,785 A | 7/1991 | Blanchard |
| 5,065,273 A | 11/1991 | Rajeevakumar |
| 5,071,782 A | 12/1991 | Mori |
| 5,072,266 A | 12/1991 | Buluccea et al. |
| 5,079,608 A | 1/1992 | Wodarczyk et al. |
| 5,105,243 A | 4/1992 | Nakagawa et al. |
| 5,111,253 A | 5/1992 | Korman et al. |
| 5,134,448 A | 7/1992 | Johnsen et al. |
| 5,142,640 A | 8/1992 | Iwanatsu |
| 5,156,989 A | 10/1992 | Williams et al. |
| 5,164,325 A | 11/1992 | Cogan et al. |
| 5,164,802 A | 11/1992 | Jones et al. |
| 5,168,331 A | 12/1992 | Yilmaz |
| 5,168,973 A | 12/1992 | Asayama et al. |
| 5,188,973 A | 2/1993 | Omura et al. |
| 5,208,657 A | 5/1993 | Chatterjee et al. |
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,242,845 A | 9/1993 | Baba et al. |
| 5,250,450 A | 10/1993 | Lee et al. |
| 5,262,336 A | 11/1993 | Pike, Jr. et al. |
| 5,268,311 A | 12/1993 | Euen et al. |
| 5,275,961 A | 1/1994 | Smayling et al. |
| 5,275,965 A | 1/1994 | Manning |
| 5,281,548 A | 1/1994 | Prall |
| 5,283,201 A | 2/1994 | Tsang et al. |
| 5,294,824 A | 3/1994 | Okada |
| 5,298,781 A | 3/1994 | Cogan et al. |
| 5,300,447 A | 4/1994 | Anderson |
| 5,300,452 A | 4/1994 | Chang et al. |
| 5,323,040 A | 6/1994 | Baliga |
| 5,326,711 A | 7/1994 | Malhi |
| 5,346,834 A | 9/1994 | Hisamoto et al. |
| 5,350,937 A | 9/1994 | Yamazaki et al. |
| 5,365,102 A | 11/1994 | Mehrotra et al. |
| 5,366,914 A | 11/1994 | Takahashi et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,436,189 A | 7/1995 | Beasom |
| 5,438,007 A | 8/1995 | Vinal et al. |
| 5,438,215 A | 8/1995 | Tihanyi |
| 5,442,214 A | 8/1995 | Yang |
| 5,473,176 A | 12/1995 | Kakumoto |
| 5,473,180 A | 12/1995 | Ludikhuize |
| 5,474,943 A | 12/1995 | Hshieh et al. |
| 5,488,010 A | 1/1996 | Wong |
| 5,519,245 A | 5/1996 | Tokura et al. |
| 5,532,179 A | 7/1996 | Chang et al. |
| 5,541,425 A | 7/1996 | Nishihara |
| 5,554,552 A | 9/1996 | Chi |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,578,851 A | 11/1996 | Hshieh et al. |
| 5,581,100 A * | 12/1996 | Ajit ............................... 257/331 |
| 5,583,065 A | 12/1996 | Miwa |
| 5,592,005 A | 1/1997 | Floyd et al. |
| 5,593,909 A | 1/1997 | Han et al. |
| 5,595,927 A | 1/1997 | Chen et al. |
| 5,597,765 A | 1/1997 | Yilmaz et al. |
| 5,605,852 A | 2/1997 | Bencuya |
| 5,616,945 A | 4/1997 | Williams |
| 5,623,152 A | 4/1997 | Majumdar et al. |
| 5,629,543 A | 5/1997 | Hshieh et al. |
| 5,637,898 A | 6/1997 | Baliga |
| 5,639,676 A | 6/1997 | Hshieh et al. |
| 5,640,034 A | 6/1997 | Malhi |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein, Jr. et al. |
| 5,679,966 A * | 10/1997 | Baliga et al. .................. 257/139 |
| 5,684,320 A | 11/1997 | Kawashima |
| 5,689,128 A | 11/1997 | Hshieh et al. |
| 5,693,569 A | 12/1997 | Ueno |
| 5,705,409 A | 1/1998 | Witek |
| 5,710,072 A | 1/1998 | Krautschneider et al. |
| 5,714,781 A | 2/1998 | Yamamoto et al. |
| 5,717,237 A | 2/1998 | Chi |
| 5,719,409 A | 2/1998 | Singh et al. |
| 5,744,372 A | 4/1998 | Bulucea |
| 5,767,004 A | 6/1998 | Balasubramanian et al. |
| 5,770,878 A | 6/1998 | Beasom |
| 5,776,813 A | 7/1998 | Huang et al. |
| 5,780,343 A | 7/1998 | Bashir |
| 5,801,417 A | 9/1998 | Tsang et al. |
| 5,814,858 A | 9/1998 | Williams |
| 5,821,583 A | 10/1998 | Hshieh et al. |
| 5,844,273 A * | 12/1998 | Konishi ........................ 257/331 |
| 5,856,692 A | 1/1999 | Williams et al. |
| 5,877,528 A | 3/1999 | So |
| 5,879,971 A | 3/1999 | Witek |
| 5,879,994 A | 3/1999 | Kwan et al. |
| 5,894,157 A | 4/1999 | Han et al. |
| 5,895,951 A | 4/1999 | So et al. |
| 5,895,952 A | 4/1999 | Darwish et al. |
| 5,897,343 A | 4/1999 | Mathew et al. |
| 5,897,360 A | 4/1999 | Kawaguchi |
| 5,900,663 A | 5/1999 | Johnson et al. |
| 5,906,680 A | 5/1999 | Meyerson |
| 5,907,776 A | 5/1999 | Hshieh et al. |
| 5,917,216 A | 6/1999 | Floyd et al. |
| 5,929,481 A | 7/1999 | Hshieh et al. |
| 5,943,581 A | 8/1999 | Lu et al. |

| | | |
|---|---|---|
| 5,949,104 A | 9/1999 | D'Anna et al. |
| 5,949,124 A | 9/1999 | Hadizad et al. |
| 5,959,324 A | 9/1999 | Kohyama |
| 5,960,271 A | 9/1999 | Wollesen et al. |
| 5,972,741 A | 10/1999 | Kubo et al. |
| 5,973,360 A | 10/1999 | Tihanyi |
| 5,973,367 A | 10/1999 | Williams |
| 5,976,936 A | 11/1999 | Miyajima et al. |
| 5,977,591 A | 11/1999 | Fratin et al. |
| 5,981,344 A | 11/1999 | Hshieh et al. |
| 5,981,996 A | 11/1999 | Fujishima |
| 5,998,833 A | 12/1999 | Baliga |
| 6,005,271 A | 12/1999 | Hsieh |
| 6,008,097 A | 12/1999 | Yoon et al. |
| 6,011,298 A | 1/2000 | Blanchard |
| 6,015,727 A | 1/2000 | Wanlass |
| 6,020,250 A | 2/2000 | Kenney |
| 6,034,415 A | 3/2000 | Johnson et al. |
| 6,037,202 A | 3/2000 | Witek |
| 6,037,628 A | 3/2000 | Huang |
| 6,037,632 A | 3/2000 | Omura et al. |
| 6,040,600 A | 3/2000 | Uenishi et al. |
| 6,048,772 A | 4/2000 | D'Anna |
| 6,049,108 A | 4/2000 | Williams et al. |
| 6,051,488 A | 4/2000 | Lee et al. |
| 6,057,558 A | 5/2000 | Yamamoto et al. |
| 6,063,678 A | 5/2000 | D'Anna |
| 6,064,088 A | 5/2000 | D'Anna |
| 6,066,878 A | 5/2000 | Neilson |
| 6,069,043 A | 5/2000 | Floyd et al. |
| 6,077,733 A | 6/2000 | Chen et al. |
| 6,081,009 A | 6/2000 | Neilson |
| 6,084,264 A | 7/2000 | Darwish |
| 6,084,268 A | 7/2000 | de Frésart et al. |
| 6,087,232 A | 7/2000 | Kim et al. |
| 6,096,608 A | 8/2000 | Williams |
| 6,097,063 A | 8/2000 | Fujihira |
| 6,103,578 A | 8/2000 | Uenishi et al. |
| 6,103,619 A | 8/2000 | Lai |
| 6,104,054 A | 8/2000 | Corsi et al. |
| 6,110,799 A | 8/2000 | Huang |
| 6,114,727 A | 9/2000 | Ogura et al. |
| 6,137,152 A | 10/2000 | Wu |
| 6,150,697 A | 11/2000 | Teshigahara et al. |
| 6,156,606 A | 12/2000 | Michaelis |
| 6,156,611 A | 12/2000 | Lan et al. |
| 6,163,052 A | 12/2000 | Liu et al. |
| 6,165,870 A | 12/2000 | Shim et al. |
| 6,168,983 B1 | 1/2001 | Rumennik et al. |
| 6,168,996 B1 | 1/2001 | Numazawa et al. |
| 6,171,935 B1 | 1/2001 | Nance et al. |
| 6,174,769 B1 | 1/2001 | Lou |
| 6,174,773 B1 | 1/2001 | Fujishima |
| 6,174,785 B1 | 1/2001 | Parekh et al. |
| 6,184,545 B1 | 2/2001 | Werner et al. |
| 6,184,555 B1 | 2/2001 | Tihanyi et al. |
| 6,188,104 B1 | 2/2001 | Choi et al. |
| 6,188,105 B1 | 2/2001 | Kocon et al. |
| 6,190,978 B1 | 2/2001 | D'Anna |
| 6,191,447 B1 | 2/2001 | Baliga |
| 6,194,741 B1 | 2/2001 | Kinzer et al. |
| 6,198,127 B1 | 3/2001 | Kocon |
| 6,201,279 B1 | 3/2001 | Pfirsch |
| 6,204,097 B1 | 3/2001 | Shen et al. |
| 6,207,994 B1 | 3/2001 | Rumennik et al. |
| 6,222,229 B1 | 4/2001 | Hebert et al. |
| 6,222,233 B1 | 4/2001 | D'Anna |
| 6,225,649 B1 | 5/2001 | Minato |
| 6,228,727 B1 | 5/2001 | Lim et al. |
| 6,239,463 B1 | 5/2001 | Williams et al. |
| 6,239,464 B1 | 5/2001 | Tsuchitani et al. |
| 6,265,269 B1 | 7/2001 | Chen et al. |
| 6,271,082 B1 | 8/2001 | Hou et al. |
| 6,271,100 B1 | 8/2001 | Ballantine et al. |
| 6,271,552 B1 | 8/2001 | D'Anna |
| 6,271,562 B1 | 8/2001 | Deboy et al. |
| 6,274,904 B1 | 8/2001 | Tihanyi |
| 6,274,905 B1 | 8/2001 | Mo |
| 6,277,706 B1 | 8/2001 | Ishikawa |
| 6,281,547 B1 | 8/2001 | So et al. |
| 6,285,060 B1 | 9/2001 | Korec et al. |
| 6,291,298 B1 | 9/2001 | Williams et al. |
| 6,291,856 B1 | 9/2001 | Miyasaka et al. |
| 6,294,818 B1 | 9/2001 | Fujihira |
| 6,297,534 B1 | 10/2001 | Kawaguchi et al. |
| 6,303,969 B1 | 10/2001 | Tan |
| 6,307,246 B1 | 10/2001 | Nitta et al. |
| 6,309,920 B1 | 10/2001 | Laska et al. |
| 6,313,482 B1 | 11/2001 | Baliga |
| 6,316,806 B1 | 11/2001 | Mo |
| 6,326,656 B1 | 12/2001 | Tihanyi |
| 6,337,499 B1 | 1/2002 | Werner |
| 6,346,464 B1 | 2/2002 | Takeda et al. |
| 6,346,469 B1 | 2/2002 | Greer |
| 6,351,018 B1 | 2/2002 | Sapp |
| 6,353,252 B1 | 3/2002 | Yasuhara et al. |
| 6,359,308 B1 | 3/2002 | Hijzen et al. |
| 6,362,112 B1 | 3/2002 | Hamerski |
| 6,362,505 B1 | 3/2002 | Tihanyi |
| 6,365,462 B2 | 4/2002 | Baliga |
| 6,365,930 B1 | 4/2002 | Schillaci et al. |
| 6,368,920 B1 | 4/2002 | Beasom |
| 6,368,921 B1 | 4/2002 | Hijzen et al. |
| 6,376,314 B1 | 4/2002 | Jerred |
| 6,376,315 B1 | 4/2002 | Hshieh et al. |
| 6,376,878 B1 | 4/2002 | Kocon |
| 6,376,890 B1 | 4/2002 | Tihanyi |
| 6,384,456 B1 | 5/2002 | Tihanyi |
| 6,388,286 B1 | 5/2002 | Baliga |
| 6,388,287 B2 | 5/2002 | Deboy et al. |
| 6,400,003 B1 | 6/2002 | Huang |
| 6,426,260 B1 | 7/2002 | Hshieh |
| 6,429,481 B1 | 8/2002 | Mo et al. |
| 6,433,385 B1 | 8/2002 | Kocon et al. |
| 6,436,779 B2 | 8/2002 | Hurkx et al. |
| 6,437,399 B1 | 8/2002 | Huang |
| 6,441,454 B2 | 8/2002 | Hijzen et al. |
| 6,444,574 B1 | 9/2002 | Chu |
| 6,452,230 B1 | 9/2002 | Boden, Jr. |
| 6,461,918 B1 | 10/2002 | Calafut |
| 6,465,304 B1 | 10/2002 | Blanchard et al. |
| 6,465,843 B1 | 10/2002 | Hirler et al. |
| 6,465,869 B2 | 10/2002 | Ahlers et al. |
| 6,472,678 B1 | 10/2002 | Hshieh et al. |
| 6,472,708 B1 | 10/2002 | Hshieh et al. |
| 6,475,884 B2 | 11/2002 | Hshieh et al. |
| 6,476,443 B1 | 11/2002 | Kinzer |
| 6,479,352 B2 | 11/2002 | Blanchard |
| 6,489,652 B1 | 12/2002 | Jeon et al. |
| 6,501,146 B1 | 12/2002 | Harada |
| 6,534,825 B2 | 3/2003 | Calafut |
| 6,566,804 B1 | 5/2003 | Trujillo et al. |
| 6,580,123 B2 | 6/2003 | Thapar |
| 6,608,350 B2 | 8/2003 | Kinzer et al. |
| 6,621,121 B2 | 9/2003 | Baliga |
| 6,657,254 B2 | 12/2003 | Hshieh et al. |
| 6,677,641 B2 | 1/2004 | Kocon |
| 6,683,346 B2 | 1/2004 | Zeng |
| 6,720,616 B2 | 4/2004 | Hirler et al. |
| 6,734,066 B2 | 5/2004 | Lin et al. |
| 6,750,506 B2 | 6/2004 | Noda et al. |
| 6,762,127 B2 | 7/2004 | Boiteux et al. |
| 6,806,533 B2 | 10/2004 | Henninger et al. |
| 6,833,584 B2 | 12/2004 | Henninger et al. |
| 7,345,342 B2 * | 3/2008 | Challa et al. ............... 257/341 |
| 7,368,777 B2 * | 5/2008 | Kocon ............... 257/302 |
| 7,638,841 B2 * | 12/2009 | Challa ............... 257/341 |
| 7,652,326 B2 * | 1/2010 | Kocon ............... 257/328 |
| 7,855,415 B2 * | 12/2010 | Challa et al. ............... 257/341 |
| 7,936,008 B2 | 5/2011 | Shenoy |
| 7,982,265 B2 * | 7/2011 | Challa et al. ............... 257/341 |
| 8,013,387 B2 * | 9/2011 | Yedinak et al. ............... 257/330 |
| 8,013,391 B2 * | 9/2011 | Yedinak et al. ............... 257/340 |
| 8,129,245 B2 * | 3/2012 | Yedinak et al. ............... 438/270 |
| 8,143,123 B2 * | 3/2012 | Grebs et al. ............... 438/259 |
| 8,143,124 B2 * | 3/2012 | Challa et al. ............... 438/270 |
| 2001/0023961 A1 | 9/2001 | Hshieh et al. |
| 2001/0026989 A1 | 10/2001 | Thapar |

| | | | |
|---|---|---|---|
| 2001/0028083 | A1 | 10/2001 | Onishi et al. |
| 2001/0032998 | A1 | 10/2001 | Iwamoto et al. |
| 2001/0041400 | A1 | 11/2001 | Ren et al. |
| 2001/0049167 | A1 | 12/2001 | Madson |
| 2001/0050394 | A1 | 12/2001 | Onishi et al. |
| 2002/0008284 | A1 | 1/2002 | Zeng |
| 2002/0009832 | A1 | 1/2002 | Blanchard |
| 2002/0014658 | A1 | 2/2002 | Blanchard |
| 2002/0027237 | A1 | 3/2002 | Onishi et al. |
| 2002/0066924 | A1 | 6/2002 | Blanchard |
| 2002/0070418 | A1 | 6/2002 | Kinzer et al. |
| 2002/0100933 | A1 | 8/2002 | Marchant |
| 2003/0001203 | A1* | 1/2003 | Ono et al. ............. 257/330 |
| 2003/0060013 | A1 | 3/2003 | Marchant |
| 2003/0132450 | A1 | 7/2003 | Minato et al. |
| 2003/0193067 | A1 | 10/2003 | Kim et al. |
| 2003/0207536 | A1 | 11/2003 | Miyasaka et al. |
| 2003/0209757 | A1 | 11/2003 | Henninger et al. |
| 2004/0016959 | A1 | 1/2004 | Yamaguchi et al. |
| 2004/0031987 | A1 | 2/2004 | Henninger et al. |
| 2004/0089910 | A1 | 5/2004 | Hirler et al. |
| 2004/0121572 | A1 | 6/2004 | Darwish et al. |
| 2004/0232407 | A1 | 11/2004 | Calafut |
| 2005/0017293 | A1 | 1/2005 | Zundel et al. |
| 2006/0011962 | A1 | 1/2006 | Kocon |
| 2008/0211012 | A1 | 9/2008 | Shenoy et al. |

FOREIGN PATENT DOCUMENTS

| | | |
|---|---|---|
| DE | 19736981 A1 | 8/1998 |
| EP | 0020164 A1 | 12/1980 |
| EP | 0975024 A2 | 1/2000 |
| EP | 1026749 A1 | 8/2000 |
| EP | 1054451 A2 | 11/2000 |
| EP | 1111683 A2 | 6/2001 |
| EP | 0747967 B1 | 2/2002 |
| EP | 1205980 A1 | 5/2002 |
| JP | 56-058267 A | 5/1981 |
| JP | 62-069562 | 3/1987 |
| JP | 62-173764 A | 7/1987 |
| JP | 63-186475 A | 8/1988 |
| JP | 63-288047 A | 11/1988 |
| JP | 63-296282 A | 12/1988 |
| JP | 64-022051 A | 1/1989 |
| JP | 01192174 A | 2/1989 |
| JP | 05226638 A | 3/1993 |
| JP | 9191109 A | 7/1997 |
| JP | 2000-040822 A | 2/2000 |
| JP | 2000-040872 A | 2/2000 |
| JP | 2000-156978 A | 5/2000 |
| JP | 2000-277726 A | 10/2000 |
| JP | 2000-277728 A | 10/2000 |
| JP | 2001-015448 A | 1/2001 |
| JP | 2001-015752 A | 1/2001 |
| JP | 2001-102577 A | 4/2001 |
| JP | 2001-111041 A | 4/2001 |
| JP | 2001-135819 A | 5/2001 |
| JP | 2001-144292 A | 5/2001 |
| JP | 2001-237423 A | 8/2001 |
| JP | 2001-244461 A | 9/2001 |
| JP | 2001-313391 A | 12/2001 |
| JP | 2002-083976 A | 3/2002 |
| JP | 2002-525872 T | 8/2002 |
| JP | 2002-531952 A | 9/2002 |
| JP | 2002-299622 A | 10/2002 |
| WO | WO 00/17931 A1 | 3/2000 |
| WO | WO 00/33386 A2 | 6/2000 |
| WO | WO 00/68997 A1 | 11/2000 |
| WO | WO 00/68998 A1 | 11/2000 |
| WO | WO 00/75965 A2 | 12/2000 |
| WO | WO 01/06550 A1 | 1/2001 |
| WO | WO 01/06557 A1 | 1/2001 |
| WO | WO 01/45155 A1 | 6/2001 |
| WO | WO 01/59847 A2 | 8/2001 |
| WO | WO 01/71815 A2 | 9/2001 |
| WO | WO 01/88997 A2 | 11/2001 |
| WO | WO 01/95385 A1 | 12/2001 |
| WO | WO 01/95398 A1 | 12/2001 |
| WO | WO 02/01644 A2 | 1/2002 |
| WO | WO 02/47171 A1 | 6/2002 |

OTHER PUBLICATIONS

Non-Final Office Action of Jun. 22, 2010 for U.S. Appl. No. 12/114,575, 27 pages.

Notice of Allowance of Dec. 18, 2007 for U.S. Appl. No. 11/140,249, 9 pages.

Notice of Allowance of Oct. 23, 2007 for U.S. Appl. No. 11/026,276, 9 pages.

Non-Final Office Action of Sep. 14, 2007 for U.S. Appl. No. 11/140,249, 10 pages.

Interview Summary of Aug. 17, 2007 for U.S. Appl. No. 11/140,249, 2 pages.

Final Office Action of May 31, 2007 for U.S. Appl. No. 11/140,249, 11 pages.

Non-Final Office Action of Mar. 28, 2007 for U.S. Appl. No. 11/026,276, 24 pages.

Non-Final Office Action of Oct. 16, 2006 for U.S. Appl. No. 11/140,249, 23 pages.

Baliga, B., "New Concepts in Power Rectifiers", Physics of Semiconductor Devices, Proceedings of the Third Int'l Workshop, Madras (India), Committee on Science and Technology in Developing Countries, 1985, pp. 471-481.

Baliga, J., "Options for CVD of Dielectrics Include Low-k Materials", Semiconductor International, Jun. 1998, 4 pages.

Baliga, B., et al., "Improving the Reverse Recovery of Rower MOSFET Integral Diodes by Electron Irradiation", 1983, Solid State Electronics, vol. 26, No. 12, pp. 1133-1141.

Brown, J., et al., "Novel Trench Gate Structure Developments Set the Benchmark for Next Generation Power MOSFET Switching Performance", Proceedings of PCIM Europe 2003, Nuremberg, Germany, May 2003, 4 pages.

Bulucea, C., et al., "Trench DMOS Transistor Technology for High Current (100 A Range) Switching", Solid-State Electronics, 1991, vol. 34, No. 5, pp. 493-507.

Chang, H.R., et al., "Numerical and Experimental Analysis of 500-V Power DMOSFET with an Atomic-Lattice Layout", IEEE Transactions on Electron Devices, 1989, vol. 36, pp. 2623.

Chang, H.R., et al., "Self-Aligned UMOSFET's with a Specific On-Resistance of 1mΩ $cm^2$", IEEE Transactions on Electron Devices, 1987, vol. 34, pp. 2329-2334.

Cheng, X., et al., "Fast Reverse Recovery Body Diode in High-Voltage VDMOSFET Using Cell-Distributed Schottky Contacts", IEEE Transactions on Electron Devices, May 2003, vol. 50, No. 5, pp. 1422-1425.

"CoolMOS™ C2 the second generation", Infineon Technologies, Product Information, 2000, 2 pages.

Curtis, T., et al., "APCVD TEOS: O3 Advanced Trench Isolation Applications", Semiconductor Fabtech, 1999, 9th Edition, 8 pages.

Darwish, M., et al., "A New Power W-Gated Trench MOSFET (WMOSFET) with High Switching Performance", ISPSD Proceedings, Apr. 2003, Cambridge, 4 pages.

Djekic, O., et al., "High Frequency Synchronous Buck Converter for Low Voltage Applications", Proceedings of IEEE Power Electronics Specialist Conference (PESC), 1998, pp. 1248-1254.

Fujihira, T., "Theory of Semiconductor Superjunction Devices", Jpn. J. Appl. Phys., Oct. 1997, vol. 36, pp. 6254-6262.

Gan, K., et al., "Poly Flanked VDMOS (PFVDMOS): A Superior Technology for Superjunction Devices", IEEE Power Electronics Specialists Conference, Jun. 17-22, 2001, Vancouver, Canada, 4 pages.

Glenn, J., et al. "A Novel Vertical Deep Trench RESURF DMOS (VTR-DMOS)", IEEE ISPD 2000, May 22-25, Toulouse France, pp. 197-200.

IR develops CoolMOS™-equivalent technology, positions it at the top of a 3-tiered line of new products for SMPS, International Rectifiers Company Information available at http://www.irf.com, 1999. 3 pages.

Kao, D., et al., "Two Dimensional Thermal Oxidation of Silicon-I. Experiments", IEEE Transactions on Electron Devices, May 1987, vol. ED-34, No. 5, pp. 1008-1017.

Kao, D., et al., "Two Dimensional Thermal Oxidation of Silicon-II. Modeling Stress Effects in Wet Oxides", IEEE Transactions on Electron Devices, Jan. 1998, vol. ED-35, No. 1, pp. 25-37.

Kassakian, J.G. et al., "High-frequency High-Density Converters for Distributed Power Supply Systems", Proceedings of the IEEE, Apr. 1988, vol. 76, No. 4, pp. 362-376.

Korman, C.S. et al., "High Performance Power DMOSFET with Integrated Schottky Diode", 1989 Proceedings IEEE Power Electronics Specialist Conference (PESC), pp. 176-179.

Lorenz, L., et al., "Cool MOS—An important milestone towards a new power MOSFET generation", Proceedings Power Conversion, May 1998, pp. 151-160.

Maksimovic, A.M., et al., "Modeling and Simulation of Power Electronic Converters", Proceedings of the IEEE, Jun. 2001, vol. 89, No. 6, pp. 898-912.

Mehrotra, M. et al., "Very Low Forward Drop JBS Rectifiers Fabricated Using Submicron Technology", IEEE Transactions on Electron Devices, Nov. 1993, vol. 40, No. 11, pp. 2131-2132.

Miller, G., "Power Management & Supply—Market, Applications Technologies—An Overview", Infineon Technologies, downloaded from the internet <<http://www.ewh.ieee.org/r8/germany/ihaspels/m_regensburg/overview_millerpdf>>, May 5, 2003, 53 pages.

Mirchandani, A., et al., "A Novel N-Channel MOSFET Featuring an Integrated Schottky and No Internal P-N Junction", Proceedings of 2004 International Symposium on Power Semiconductor Devices & ICs, (ISPSD), Kitakyushu, Japan, May 24-27, 2004, pp. 405-408.

Moghadam, F., "Delivering Value Around New Industry Paradigms," Applied Materials, Dielectric Systems & Modules Group, Nov. 1999, vol. 1, Issue No. 2, pp. 1-11.

Park, J., et al., "Lateral Trench Gate Super-Junction SOI-LDMOSFETs with Low On-Resistance", ESSDERC 2002, Institute for Microelectronics, University of Technology, Vienna, Austria, pp. 283-285.

Sakai, T., et al., "Experimental Investigation of Dependence of Electrical Characteristics of Device Parameters in Trench MOS Barrier Schottky Diodes", Proceedings of 1998 International Symposium on Power Semiconductors and ICs, Kyoto, Japan, Technical Digest, pp. 293-296.

Shenai, K., et al., "Current Transport Mechanisms in Atomically Abrupt Metal-Semiconductor Interfaces", IEEE Transactions on Electron Devices, Apr. 1988, vol. 35, No. 4, pp. 468-482.

Shenai, K., et al., "Monolithically Integrated Power MOSFET and Schottky Diode with Improved Reverse Recovery Characteristics", IEEE Transactions on Electron Devices, Apr. 1990, vol. 37, No. 4, pp. 1167-1169.

Shenoy, P., et al. "Analysis of the Effect of Charge Imbalance on the Static and Dynamic Characteristic of the Super Junction MOSFET", IEEE International Symposium on Power Semiconductor Devices, 1999, pp. 99-102.

Singer,. P., "Empty Spaces in Silicon (ESS): An Alternative to SOI", Semiconductor International, Dec. 1, 1999, 2 pages, Retrieved on Oct. 16, 2001 from http:/www.e-insite.net/semiconductor/index.asp?layout=articleid_CA169972&in . . . .

Tabisz, W., et al., "A MOSFET Resonant Synchronous Rectifier for High-Frequency DC/DC Converters", Proceedings of IEEE Power Electronics Specialist Conference (PESC), 1990, pp. 769-779.

Technical Literature from Quester Technology, Model APT-4300, 300mm Atmospheric TEOS/Ozone CVD System, (unknown date), 3 pages.

Technical Literature from Quester Technology, Model APT-6000 Atmospheric TEOS-Ozone CVD System, (unknown date), 2 pages.

Technical Literature from Silicon Valley Group Thermal Systems, "APNext™, The Next Generation of APCVD Products, High Throughput APCVD Cluster Tool for 200 mm/300 mm Wafer Processing", (unknown date), 2 pages.

Tu, S., et al. "On the Reverse Blocking Characteristics of Schottky Power Diodes", IEEE Transactions on Electron Devices. Dec. 1992, vol. 39, No. 12, pp. 2813-2814.

Ueda, D., et al. "An Ultra-Low On-Resistance Power MOSFET Fabricated by Using a Fully Self-Aligned Process", IEEE Transactions on Electron Devices, Apr. 1987, vol. 34, pp. 926-930.

Wilamowski, B., "Schottky Diodes with High Breakdown Voltages", Solid-State Electronics, 1983, vol. 26, pp. 491-493.

Wolf, S., et al., "Silicon Processing for The VLSI Era, vol. 1—Process Technology, Second Edition", 1990, 2 pages.

Wolf, S., et al., "Silicon Processing for The VLSI Era, vol. 2: Process Integration", 1990, Lattice Press 3 pages.

Yamashita, N., et al., "Conduction Power Loss in MOSFET Synchronous Rectifier with Parallel-Connected Schottky Barrier Diode", IEEE Transactions on Power Electronics, Jul. 1998, vol. 13, No. 4, pp. 667-673.

* cited by examiner

METHOD FOR FORMING ACCUMULATION-MODE FIELD EFFECT TRANSISTOR WITH IMPROVED CURRENT CAPABILITY

CROSS-REFERENCE TO RELATED APPLICATIONS

This is a division of U.S. application Ser. No. 12/114,575, filed May 2, 2008, which is a continuation of U.S. application Ser. No. 11/140,249, filed May 26, 2005, now U.S. Pat. No. 7,368,777, which claims the benefit of U.S. Provisional Application No. 60/588,845, filed Jul. 15, 2004, and U.S. Provisional Application No. 60/669,063, filed Apr. 6, 2005, which are commonly assigned and incorporated herein by reference in their entirety for all purposes. Also, U.S. application Ser. No. 11/140,249 is a continuation-in-part of U.S. patent application Ser. No. 11/026,276, filed Dec. 29, 2004, now U.S. Pat. No. 7,345,342, which is commonly assigned and incorporated herein by reference in its entirety for all purposes.

BACKGROUND

The present invention relates in general to the semiconductor technology and more particularly to semiconductor accumulation-mode power devices with charge balance structures integrated therein.

FIG. 1 shows a cross section view of a conventional trenched-gate accumulation-mode vertical MOSFET 100. MOSFET 100 is an n-channel transistor with a gate terminal formed inside each of trenches 102, n-type regions 112 between trenches 102 (hereinafter referred to as the channel regions), a drift region 106, and an n-type drain region 114. Unlike enhancement-mode transistors, accumulation-mode transistor 100 does not include a blocking (p-type in this example) well or body region inside which the conduction channel is formed. Instead a conducting channel is formed when an accumulation layer is formed in channel regions 112. Transistor 100 is normally on or off depending on doping concentration of channel regions 112 and doping type of the gate electrodes. It is turned off when channel regions 112 are entirely depleted and lightly inverted. Because no inversion channel is formed, the channel resistance is eliminated thus improving the transistor power handling capability and its efficiency. Further, with no pn body diode, the losses in synchronous rectification circuits attributable to the pn diode are eliminated.

A drawback of accumulation transistor 100 is that drift region 106 needs to be lightly doped to support a high enough reverse bias voltage. However, a lightly doped drift region results in a lower on-resistance and lower efficiency. Thus, there is a need for an accumulation-mode transistor with low on-resistance, high blocking capability, and improved efficiency.

BRIEF SUMMARY

In accordance with an embodiment of the present invention, a method of forming an accumulation-mode field effect transistor includes forming a channel region of a first conductivity type in a semiconductor region of the first conductivity type. The channel region may extend from a top surface of the semiconductor region to a first depth within the semiconductor region. The method also includes forming gate trenches in the semiconductor region. The gate trenches may extend from the top surface of the semiconductor region to a second depth within the semiconductor region below the first depth. The method also includes forming a first plurality of silicon regions of a second conductivity type in the semiconductor region such that the first plurality of silicon regions form P-N junctions with the channel region along vertical walls of the first plurality of silicon regions.

In one embodiment, the first plurality of silicon regions and the gate trenches are alternately arranged so that each of the first plurality of silicon regions is between but laterally spaced from two adjacent gate trenches.

In another embodiment, conduction channels are formed in the channel region along the sidewalls of the gate trenches when the accumulation-mode field effect transistor is in the on state.

In another embodiment, forming the first plurality of silicon regions includes forming body trenches in the semiconductor region, the body trenches extending from the top surface of the semiconductor region to a depth within the semiconductor region below the first depth, and substantially filling the body trenches with silicon material of the second conductivity type. The body trenches and the gate trenches may be alternately arranged so that each body trench is between but laterally spaced from two adjacent gate trenches.

In another embodiment, the first plurality of silicon regions may be formed by implanting dopants of the second conductivity type into the semiconductor region.

In another embodiment, the method also includes forming a gate electrode in each gate trench, the gate electrode being adjacent to but insulated from the channel region.

In another embodiment, the semiconductor region includes an epitaxial layer extending over and in contact with a substrate. The substrate and the epitaxial layer may be the first conductivity type, and the epitaxial layer may have a lower doping concentration than the substrate. The channel region, the trenches and the first plurality of silicon regions may extend into the epitaxial layer.

In another embodiment, the method may also include forming a second plurality of silicon regions of the first conductivity type in the channel region such that each pair of the second plurality of silicon regions flanks sides of a corresponding one of the gate trenches.

The second plurality of silicon regions may have a higher doping concentration than that of the channel region. The method may also include forming a resistor coupled between the first plurality of silicon regions and the second plurality of silicon regions.

In another embodiment, the gate trenches and the first plurality of silicon regions are parallel-extending continuous stripes.

In another embodiment, the first plurality of silicon regions are formed in the semiconductor region such that an uppermost surface of each of the first plurality of silicon regions is below the top surface of the semiconductor region.

In yet another embodiment, the method may also include forming columns of silicon of the second conductivity type in the semiconductor region so that the columns of silicon of the second conductivity type and the semiconductor region together form alternating columns of first and second conductivity type silicon. No current may flow through the columns of silicon of the second conductivity type when the accumulation-mode field effect transistor is in the on state.

In still another embodiment, each of the columns of silicon of the second conductivity type extend directly below a corresponding one of the plurality of first silicon regions.

These and other embodiments of the invention will be described with reference to the accompanying drawings and following detailed description.

DETAILED DESCRIPTION

In accordance with the present invention, charge spreading techniques are advantageously integrated in vertical and lateral accumulation-mode power devices to achieve lower on-resistance, higher blocking capability and improved efficiency.

Figure 1:
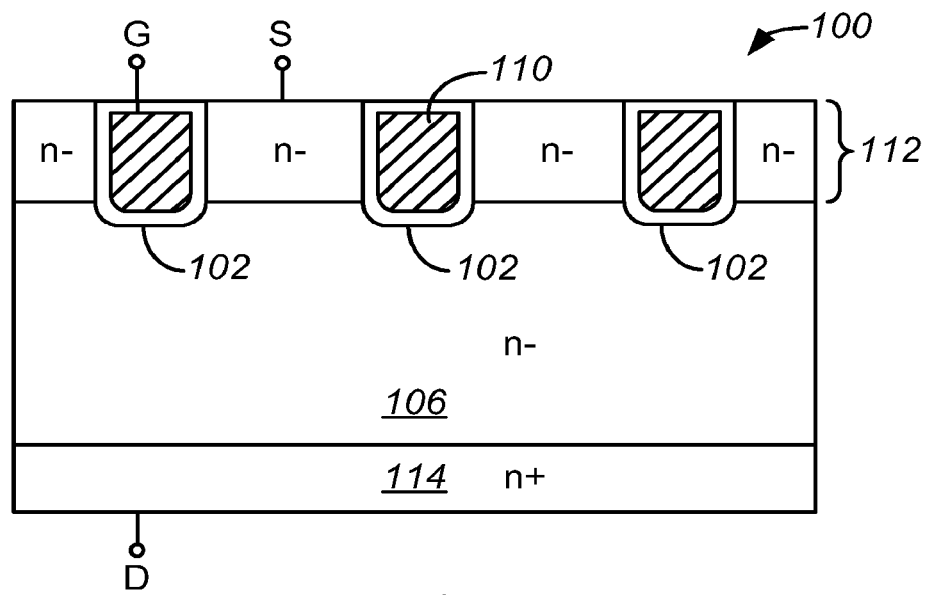
FIG. 1 shows a cross section view of a conventional trenched-gate accumulation-mode vertical field effect transistor.
Figure 2:
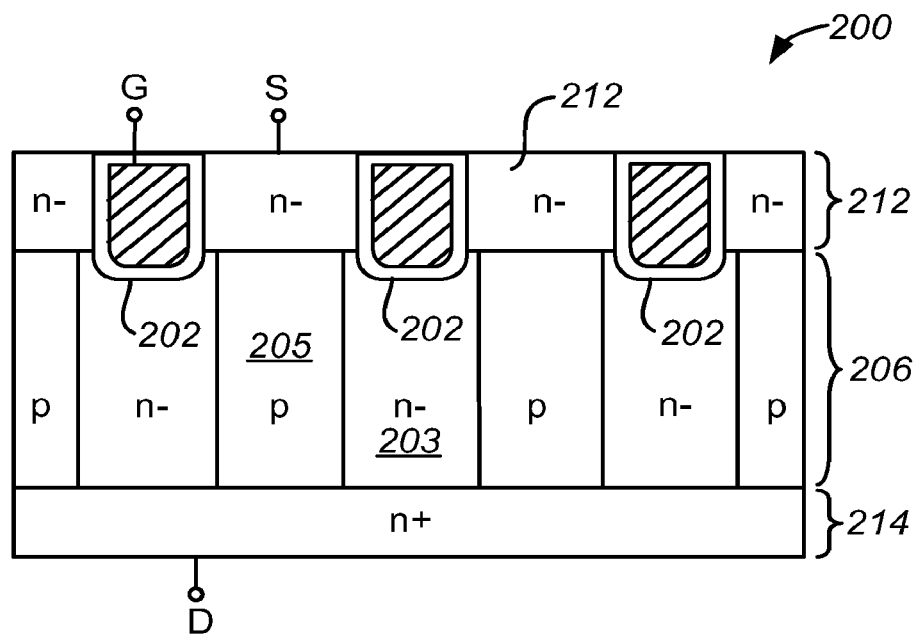
FIG. 2 shows a cross section view of an exemplary trenched-gate accumulation-mode vertical field effect transistor with alternate conductivity type regions in accordance with an embodiment of the invention.

FIG. 2 shows a simplified cross section view of an exemplary accumulation-mode field effect transistor 200 with alternate conductivity regions 203, 205 extending vertically parallel to the current flow. In this example, transistor 200 is an n-channel transistor with a gate terminal formed inside each of trenches 202, n-type channel regions 212 between trenches 202, a drift region 206 that includes opposite polarity columnar n-type and p-type sections 203 and 205, and an n-type drain region 214. Unlike enhancement-mode transistors, accumulation-mode transistor 200 does not include a blocking (p-type in this example) well or body region inside which the conduction channel is formed. Instead a conducting channel is formed when an accumulation layer is formed in channel regions 212. Transistor 200 is normally on or off depending on doping concentration of channel regions 212 and doping type of the gate electrodes. It is turned off when channel regions 212 are entirely depleted and lightly inverted.

In the embodiments describe herein, those portions of the drift region through which current flows when the transistor is in an on state are referred to as the conduction regions.

The doping concentrations in opposite polarity regions 203 and 205 are adjusted to maximize charge spreading, which enables the transistor to support higher voltages and also results in more efficient use of the silicon. The use of columnar opposite polarity regions parallel to the current flow flattens the electric field distribution in the conduction regions by not allowing it to decrease linearly away from the junction formed between regions 212 and 206. The charge spreading effect of this structure allows the use of a more highly doped drift region 206 which advantageously reduces transistor on-resistance. The doping concentration of the various regions may vary; for example, n-type regions 212 and 203 may have the same or different doping concentrations. The embodiment wherein n-type regions 212 and 203 have the same doping concentration is simpler to manufacture and thus less costly, and is attractive for use in low voltage applications. Those skilled in the art appreciate that an improved p-channel transistor can be obtained by reversing the polarities of the various regions of the transistor shown in FIG. 2.

An exemplary method of forming the accumulation-mode transistor in FIG. 2 is as follows. An n-type epitaxial layer is formed over substrate 214 in accordance with conventional methods. Using a masking layer, columns of silicon are removed from the epitaxial layer using conventional silicon etching techniques. Silicon material 205 of p-type conductivity is then formed in the removed columns of silicon using known techniques. An n-type epitaxial layer 212 is then formed over epitaxial layer 206 using conventional techniques. Trenched gate structures are then formed in epitaxial layer 212 using known methods.

Figure 3:
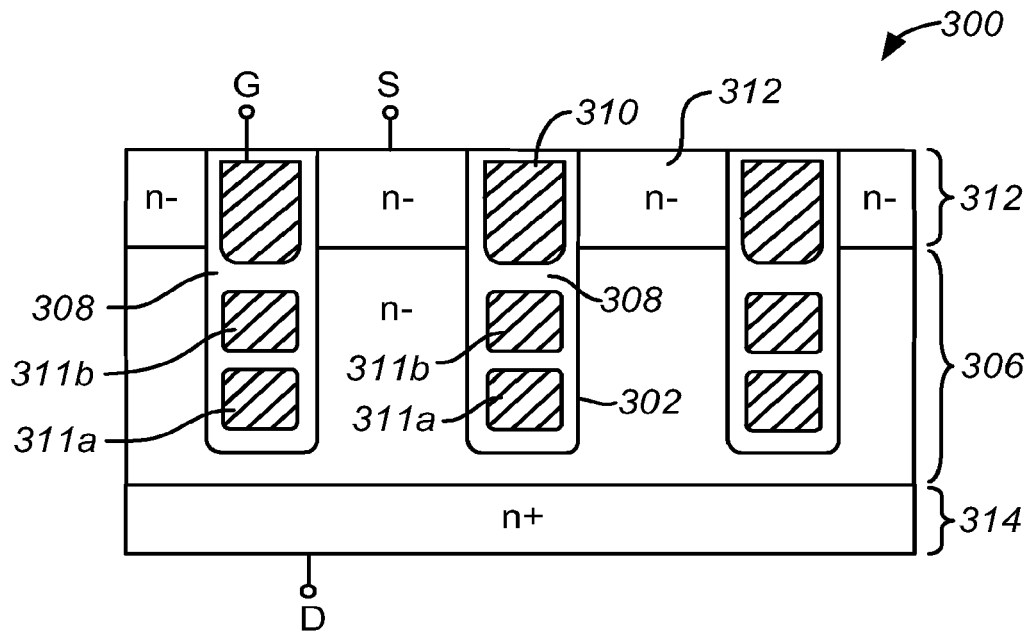
FIGS. 3 and 4 show cross section views of two exemplary trenched-gate accumulation-mode vertical field effect transistors with trenched electrodes in accordance with other embodiments of the invention.
Figure 4:
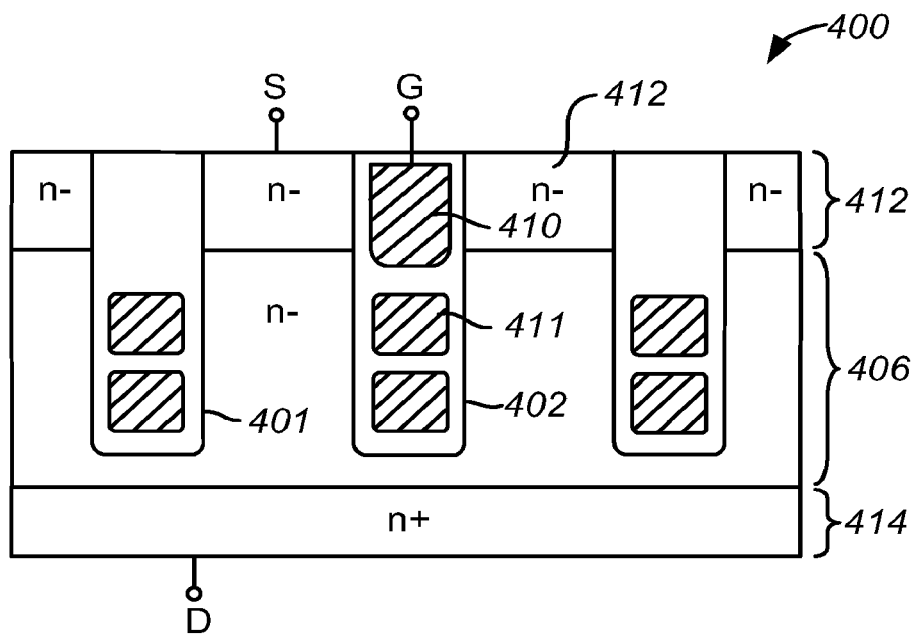

FIG. 3 is a simplified cross section view of another accumulation-mode field effect transistor 300 with trenched electrodes for charge spreading purposes. Channel regions 312, drift region 306 and drain region 314 are all of the same conductivity type which in this example is n-type. The doping concentration of channel regions 312 is adjusted to form a depleted blocking junction under no bias conditions. Inside each trench 302, one or more buried electrodes 311 are formed under gate electrode 310, all insulated from one another and from drift region 306 by dielectric material 308. Buried electrodes 311 act as field plates and can be biased, if desired, to a potential that optimizes their charge spreading effect. Since charge spreading can be controlled by independently biasing buried electrodes 311, the maximum electric field can be increased significantly. Different variations of this structure are possible. For example, the depth of trench 302 and the size and number of buried electrodes 311 can vary depending on the application. Charge spreading electrodes can be buried inside trenches that are separate from active trenches that house the transistor gate electrode. An example of such an embodiment is shown in FIG. 4.

A method of forming the structure in FIG. 3 is as follows. An n-type epitaxial layer is formed over substrate 314. An n-type layer 312 is formed along an upper portion of the epitaxial layer by implanting dopants into the epitaxial layer. Depending on the desired doping concentration, n-type dopants may be implanted into the epitaxial layer so that n-type layer 312 has a higher doping concentration than drift region 306 of the epitaxial layer, or alternatively, p-type counter-dopants may be implanted into the epitaxial layer so that n-type layer 312 has a lower doping concentration than drift region 306 of the epitaxial layer. In another embodiment, regions 306 and 312 are formed by growing two n-type epitaxial layers having different doping concentrations. An exemplary set of process steps for forming the trenched electrodes are described in the above-referenced commonly assigned U.S. patent application Ser. No. 10/821,796 titled "Schottky Diode Using Charge Balance Structure," filed Apr. 9, 2004, incorporated herein by reference in its entirety. The trenched-gate structures are formed using conventional techniques.

Figure 5:
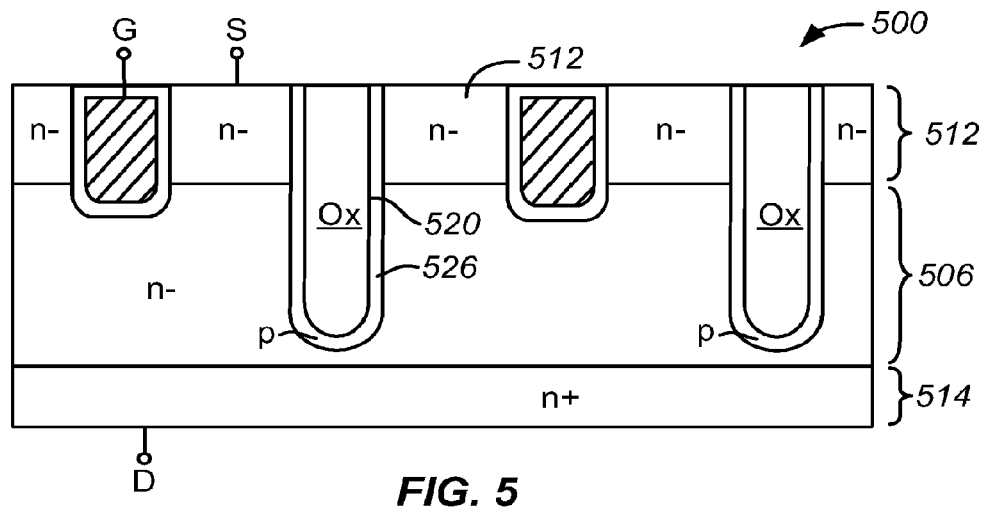
FIGS. 5 and 6 are cross section views of two exemplary trenched-gate accumulation-mode vertical field effect transistors with dielectric-filled trenches in accordance with other embodiments of the invention.

Another embodiment for an improved accumulation-mode transistor employs dielectric-filled trenches with an opposite polarity exterior liner. FIG. 5 is a simplified cross section view of an accumulation transistor 500 according to this embodiment. Dielectric-filled trenches 520 extend downward from the surface of the silicon well into drift region 506. Trenches 520 are substantially filled with dielectric material such as silicon dioxide. In this exemplary embodiment, transistor 500 is an n-channel transistor with trenched-gate structure. A p-type region 526 lines the exterior sidewalls and bottom of dielectric-filled trenches 520 as shown. Dielectric-filled trenches 520 reduce the output capacitance of the transistor while p-type liner 526 provides for charge balancing in the drift region to increase the blocking capability of the transistor. In one exemplary method of forming transistor 500, regions 506 and 512 are formed in a similar manner to previous embodiments. A set of process steps for forming the dielectric-filled trenches is disclosed in the above-referenced commonly assigned U.S. Pat. No. 6,376,878 to Christopher B. Kocon, titled "MOS-Gated Devices with Alternating Zones of Conductivity," incorporated herein in its entirety. The trenched-gate structures are formed using conventional techniques.

Figure 6:
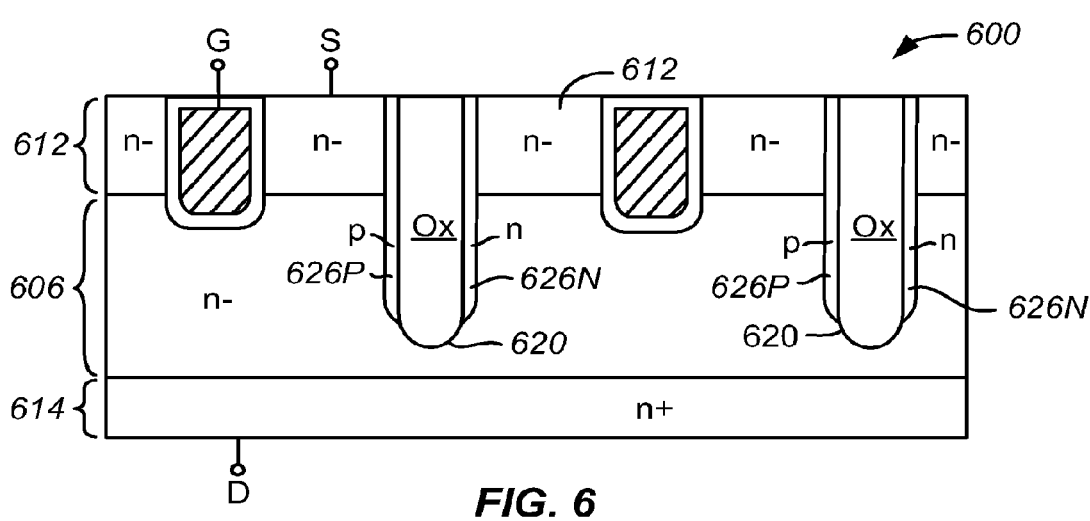

In an alternative embodiment shown in FIG. 6, oppositely doped liners 626N and 626P are formed adjacent the opposite sidewalls of a dielectric-filled trench 620. That is, a dielectric-filled trench 620 has a p-type liner 626P extending along the exterior sidewall on one side, and an n-type liner 626N extending along the exterior sidewall on the opposite side of the same trench. Other variations of this accumulation transistor with dielectric-filled trenches are possible. These include, for example, an accumulation transistor with a planar (as opposed to trenched) gate structure; an accumulation transistor with a p-type liner that covers only the exterior sidewalls and not the bottom of trenches 526; and an accumulation transistor with a single trench structure with a p-type liner that lines the lower portion of the trench.

Figure 7:
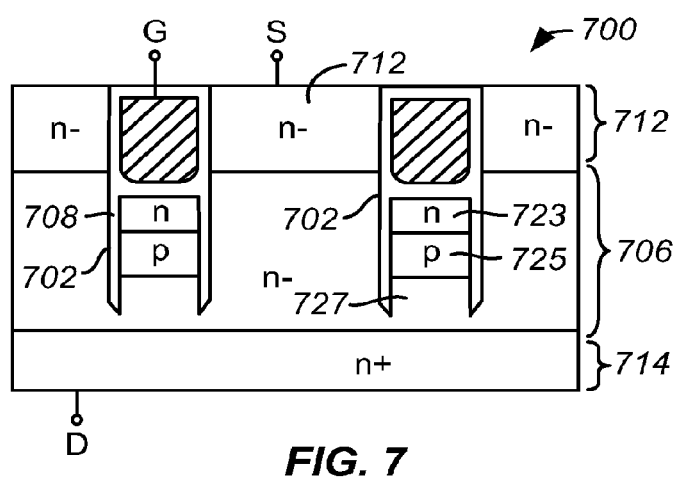
FIGS. 7 and 8 show cross section views of two exemplary trenched-gate accumulation-mode vertical field effect transistors with trenched diodes in accordance with other embodiments of the invention.

In another embodiment, an accumulation-mode transistor employs one or more diodes stacked inside a trench for charge balancing purposes. A simplified cross section view of an exemplary accumulation-mode transistor 700 according to this embodiment is shown in FIG. 7. In this embodiment, the charge balancing diodes are formed inside the same trench as the gate. Trench 702 includes gate electrode 710 below which n-type 723 and p-type 725 silicon or doped polysilicon layers form pn junctions. A dielectric layer 708 separates the diode structure from gate terminal 702 as well as drift region 706. As shown, there is no dielectric layer along the bottom of trenches 720, thus allowing the bottom region 727 to be in electrical contact with the underlying region. In one embodiment, similar considerations to those dictating the design and manufacture of the gate oxide of MOS transistors are applied in designing and forming insulating layer 708. For example, as in gate oxide of MOS transistors, the thickness of insulating layer 708 is determined by such factors as the voltage that insulating layer 708 is required to sustain and the extent to which the electric field in the trench diode is to be induced in drift region 706 (i.e., the extent of coupling through the insulating layer). The charge spreading in this embodiment is controlled by the optimization of the diode avalanche breakdown and the width of the depletion in the trenched diodes described more fully next.

As is well-known in this art, under reverse-bias conditions, the electric field is highest at the junction between regions 706 and 712 and linearly reduces in drift region 706 in the direction away from the junction between regions 706 and 712 at a rate dictated by the doping concentration of regions 712 and 714. It is also well known that the larger the area under the electric field curve (i.e., the lower the rate at which the electric field reduces), the greater is the breakdown voltage. During operation, the diodes embedded in trenches 702 are reverse biased and thus the electric field is highest at the diode junctions (e.g., at the junction between opposite conductivity type regions 725 and 723). Through insulating layer 708, the electric field in the trench diodes induces a corresponding electric field in drift region 706. The induced field is manifested in drift region 706 in the form of an up-swing spike and a general increase in the electric field curve in drift region 706. This increase in the electric field results in a larger area under the electric field curve, which in turn results in a higher breakdown voltage.

It can be seen that by using multiple diodes in trenches 702, multiple spikes can be induced along the depth of conduction regions in drift region 706. This results in an electric field curve which tapers down from its highest level at a far lower rate than in conventional structures. An almost trapezoidal-shaped area can thus be obtained under the electric field curve in drift region 706 as opposed to the conventional triangular shape. A far greater breakdown voltage can thus be obtained.

When structure 700 is biased in the conduction state, current passes through conduction region of drift region 706. By introducing diode trenches 702, the electric filed across the reverse-biased trenched diodes influences the charge distribution in adjacent drift region 706 such that a more uniform charge spreading is obtained in drift region 706. By spreading the charge more uniformly in drift regions 706, the silicon area taken up by drift region 706 is more efficiently used. Hence, for the same size drift region 706, the portion of the on-resistance attributable to the conduction region of drift region 706 is, in effect, reduced. This enables reducing the cell pitch for the same on-resistance. Accordingly, diode trenches 706 enable optimizing structure 700 to have higher breakdown voltage, lower on-resistance, and smaller cell pitch than can be achieved by conventional techniques.

Figure 8:
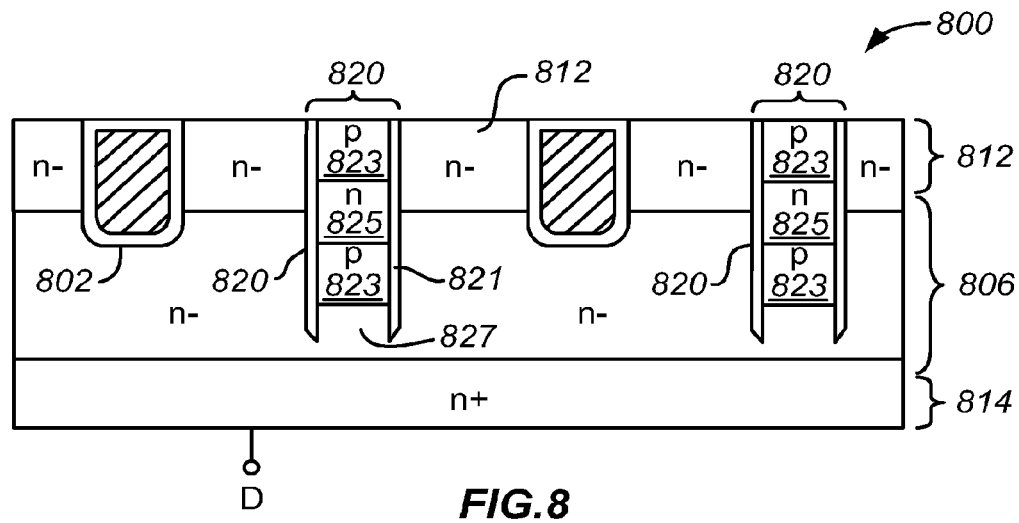

Other variations of accumulation-mode transistor 700 are possible. One such variation is shown in FIG. 8. In this embodiment, diode trenches 820 are disposed on either sides of gate trenches 802, extending well into drift region 806. Diode trenches 820 include one or more diode structures made up of opposite conductivity type regions 823 and 825 that form one or more pn junctions inside the trench. A thin dielectric layer 821 extending along the trench inner sidewalls insulates the diodes in the trench from drift region 806. In another variation of FIG. 8, not shown, one or more charge electrodes are formed in the gate trench below the gate electrode.

An exemplary method of forming the structure in FIG. 8 is as follows. An n-type epitaxial layer is formed over substrate 814. N-type region 812 is formed in the epitaxial layer by implanting dopants into the epitaxial layer. Depending on the desired doping concentration, n-type dopants may be implanted into the epitaxial layer so that channel regions 812 have a higher doping concentration than portion 806 of the epitaxial layer, or alternatively, p-type counter-dopants may be implanted into the epitaxial layer so that channel regions 812 have a lower doping concentration than portion 806 of the epitaxial layer. In another embodiment, regions 806 and 812 are formed by growing two n-type epitaxial layers having different doping concentrations. An exemplary set of process steps for forming the trenched diodes are described in the above-referenced commonly assigned patent application Ser. No. 10/821,796 titled "Schottky Diode Using Charge Balance Structure," filed Apr. 9, 2004, incorporated herein by reference in its entirety. The trenched-gate structures are formed using conventional techniques.

FIGS. 2-8 illustrate accumulation transistor embodiments in which various charge balancing structures are integrated in an optimum manner to improve the transistor blocking capability, on-resistance, and current density of the transistor. In FIGS. 9-14, the transistor embodiment with the trenched electrodes as shown in FIG. 3 is used to show various structural modifications and features each with its own distinct advantages. Although FIGS. 9-14 show these structural modifications in the context of the trenched electrodes transistor embodiment of FIG. 3, one or more of these structural modifications and features can be combined with one or more of the various charge balancing structures illustrated in FIGS. 2-8 depending on the desired goals and performance criteria.

Figure 9:
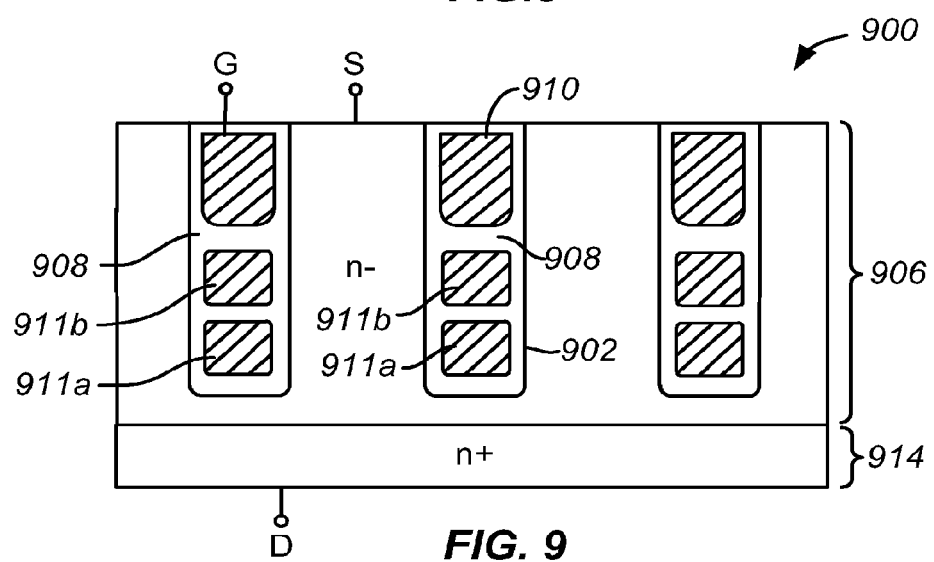
FIG. 9 shows a cross section view of a variation of the FIG. 3 embodiment wherein the channel regions and the drift region are merged (i.e., have the same doping concentration) in accordance with another embodiment of the invention.

In FIG. 9, the channel regions in which the conduction channel is formed (e.g., regions 312 in FIG. 3) are merged with the drift region to form a single region 906 in which trenches 902 are formed. Thus, drift region 906 extends from the top surface of the structure to substrate 914. Transistor 900 operates in the same manner as transistor 300 in FIG. 3. This embodiment has the advantage of a simpler manufacturing process because of elimination of the processing steps associated with forming the channel regions between the trenches. To maintain the same transistor current capability as the FIG. 3 structure, the doping concentration in region 906 needs to be increased. This in turn reduces the transistor voltage blocking capability. But, due to the presence of the charge balancing trenched electrodes, the increased doping concentration does not result in as much of a reduction in the transistor blocking capability. It is to be understood that the channel regions in the other embodiments illustrated in FIGS. 4-8 may similarly be merged with the drift region.

Figure 10:
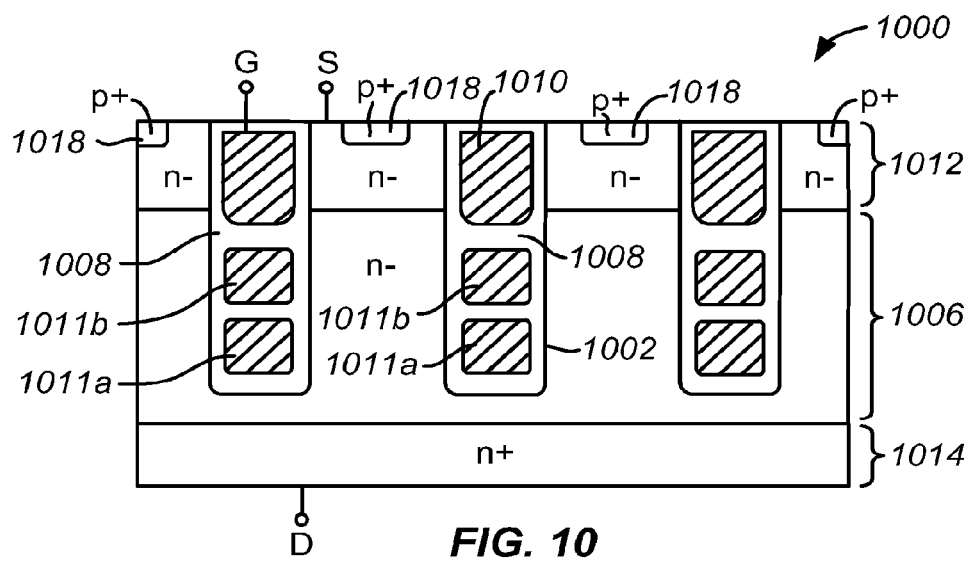
FIGS. 10 and 11 show cross section views of two variations of the FIG. 3 embodiment wherein heavily doped opposite conductivity-type regions are formed in the channel regions in accordance with other embodiments of the invention.
Figure 11:
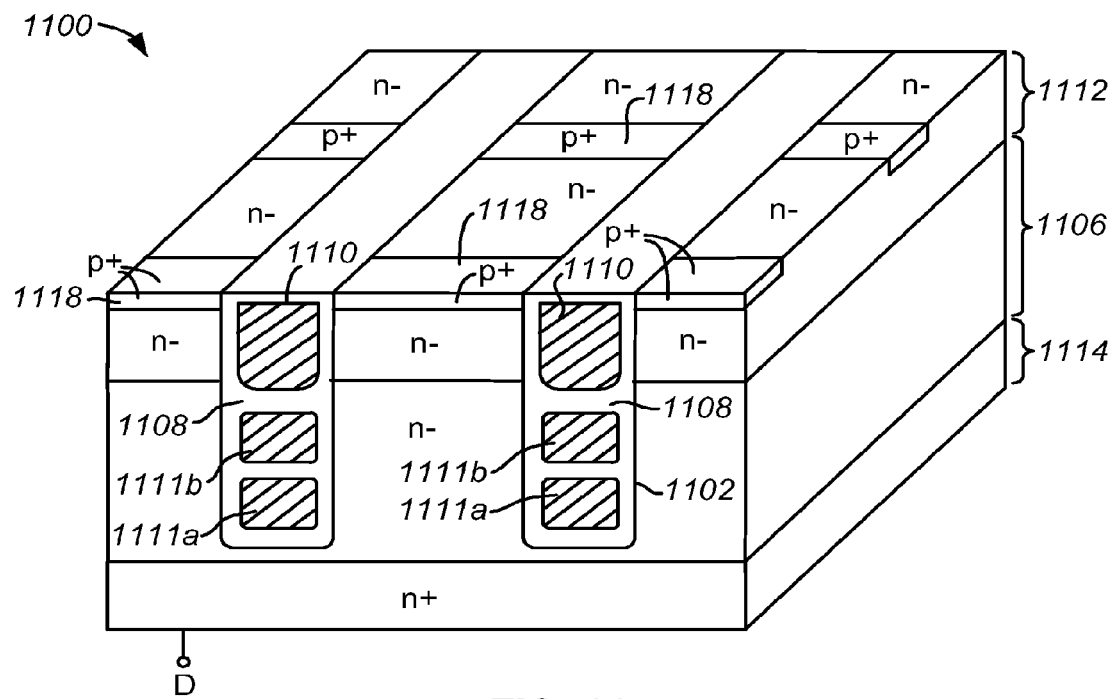

In FIG. 10, heavily doped p-type regions 1018 are formed in channel regions 1012 between trenches 1002. P-type regions 1018 minimize the area of channel regions 1012 and reduce device leakage. P-type regions 1018 also allow for p+ contact which improve hole current flow in avalanche and improve device robustness. Each of p+ regions 1018 may be a single continuous region extending the length of the mesa (i.e., in the dimension perpendicular to the page) between trenches, or may be one of multiple p+ regions formed at intervals along the length of the mesa between the trenches. FIG. 11 shows a three-dimensional view of a variation of the structure in FIG. 10. As shown, p+ regions 1118 laterally extend to abut the trenches between which they are located. However, p+ regions 1118 are formed at intervals along the length of the mesa so that channel regions 1112 can be contacted along their top surface in order to accommodate current flow when the transistor is turned on. An advantage of extending the p+ region between adjacent trenches as compared to FIG. 10 wherein p+ regions 1018 are laterally spaced from the trenches is that the alignment tolerance required by the spacing between the p+ regions and the edge of trenches in FIG. 10 is eliminated thus resulting in a smaller cell pitch. The p+ regions can be used in a similar manner in any one of the accumulation transistors described herein.

Figure 12:
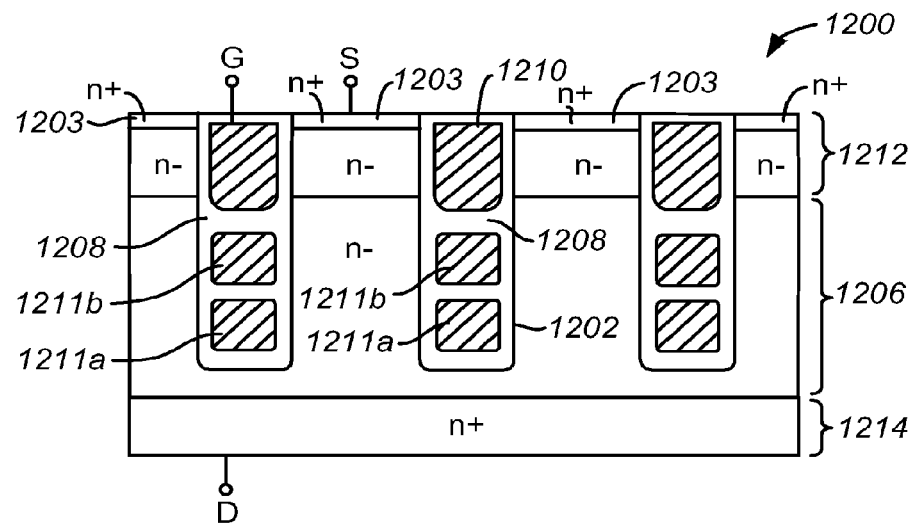
FIGS. 12 and 13 show cross section views of two variations of the FIG. 3 embodiment wherein heavily doped same conductivity-type regions are formed in the channel regions in accordance with other embodiments of the invention.
Figure 13:
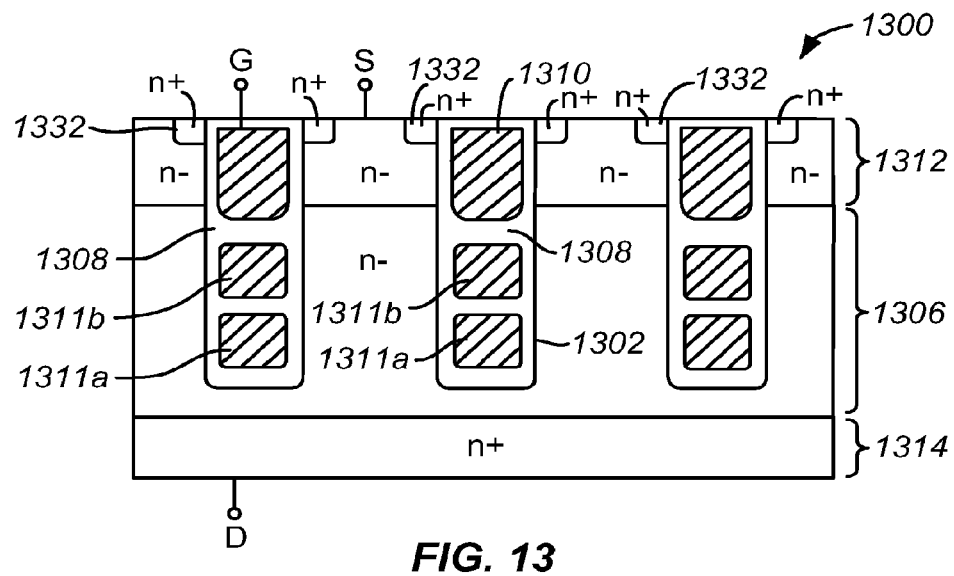
Figure 14:
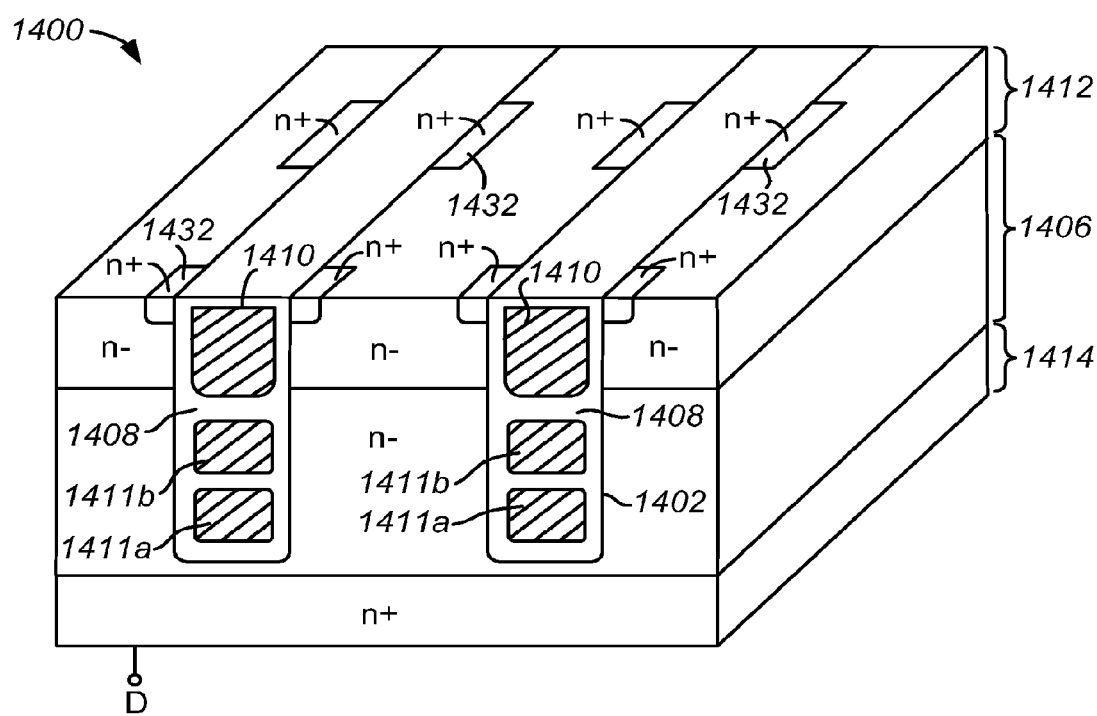
FIG. 14 shows a three dimensional view of the FIG. 13 embodiment.

In FIG. 12, n-type channel regions 1212 include more heavily doped shallow n+ source regions 1203. Heavily doped source regions 1203 result in better contact with the overlying source electrode, and thus reduce the contact resistance. Heavily doped source regions 1203 can extend along the top surface of channel regions 1212 between trenches as shown in FIG. 12, or can alternatively be formed as two regions adjacent trench sidewalls along the top edge of channel regions 1212 as shown in FIG. 13. An advantage of this approach is the source metal contacting lightly doped channel regions 1212 forms a Schottky contact therebetween which helps minimize leakage current. FIG. 14 shows a 3-dimensional view of the structure illustrated in FIG. 13. As shown, n+ source regions 1432 are formed at intervals along the length of the mesa between trenches in channel regions 1412. N+ regions 1432 may alternatively be a single continuous region extending the length of the mesa between trenches. The heavily doped source regions as illustrated in FIGS. 12-14 can be used in the same manner in any one of the accumulation transistors described herein. The heavily doped regions in FIGS. 10-14 can be formed in respective channel regions using known masking and implanting techniques.

Figure 15:
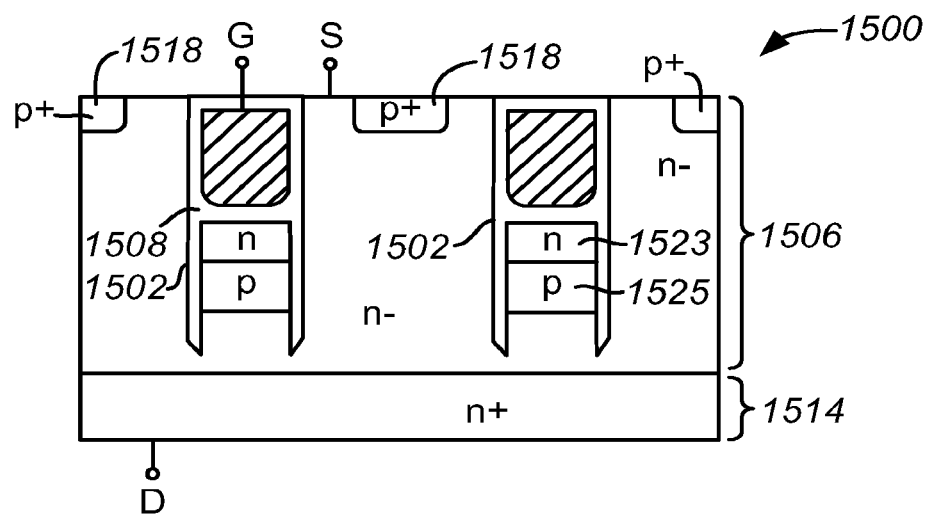
FIG. 15 shows a cross section view of a variation of the FIG. 7 embodiment wherein the channel regions are merged with the drift region (i.e., have the same doping concentration), and heavily doped opposite conductivity-type regions are formed in the channel regions in accordance with another embodiment of the invention.
Figure 16:
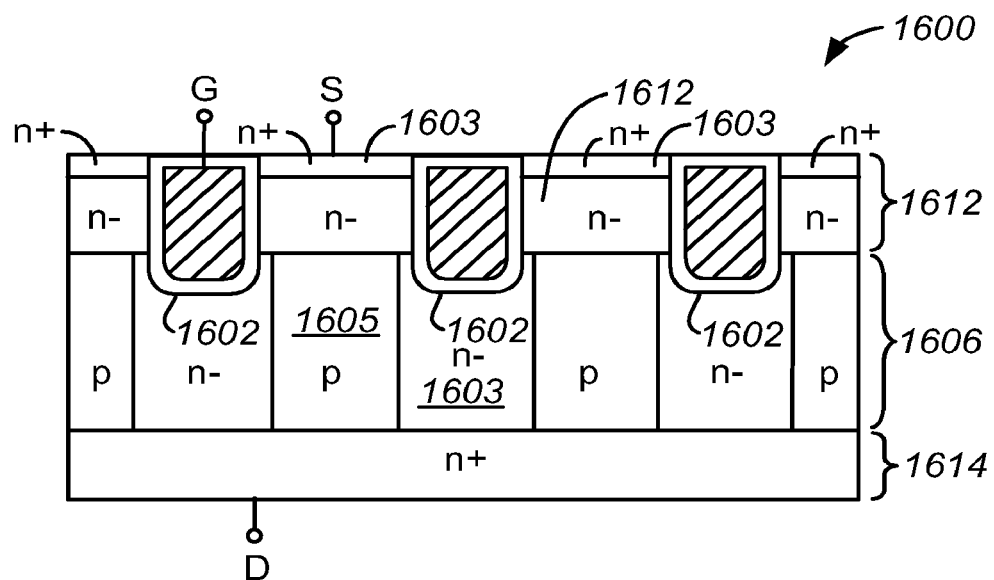
FIG. 16 shows a cross section view of a variation of the FIG. 2 embodiment wherein heavily doped same conductivity-type regions are formed in the channel regions in accordance with another embodiment of the invention.

It is to be understood that any of the charge balancing structures illustrated in FIGS. 2-8 may be combined with one or more of the structural variations and features illustrated in FIGS. 9-14 as desired. For example, FIG. 15 shows the charge balancing structure illustrated in FIG. 7 in combination with the highly-doped p+ regions, wherein the channel regions are merged with the drift region to form a single silicon region 1506 in which the trenches are formed. FIG. 16 shows another example wherein the charge balancing structure illustrated in FIG. 2 is combined with the highly doped n+ regions.

Figure 17:
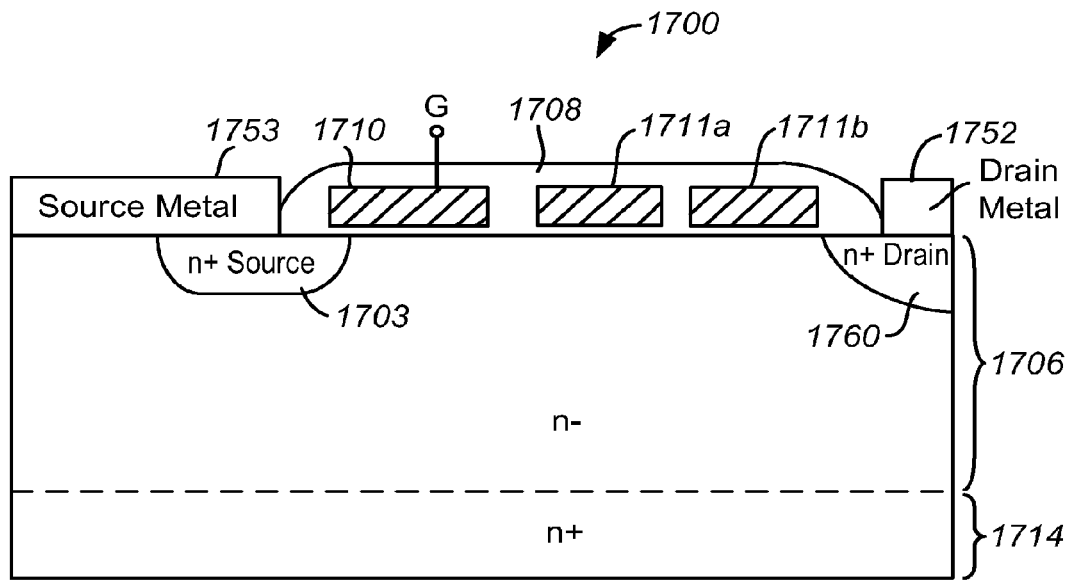
FIG. 17 shows a cross section view of an exemplary planar-gate accumulation-mode lateral field effect transistor with charge balancing electrodes in accordance with another embodiment of the invention.
Figure 18A:
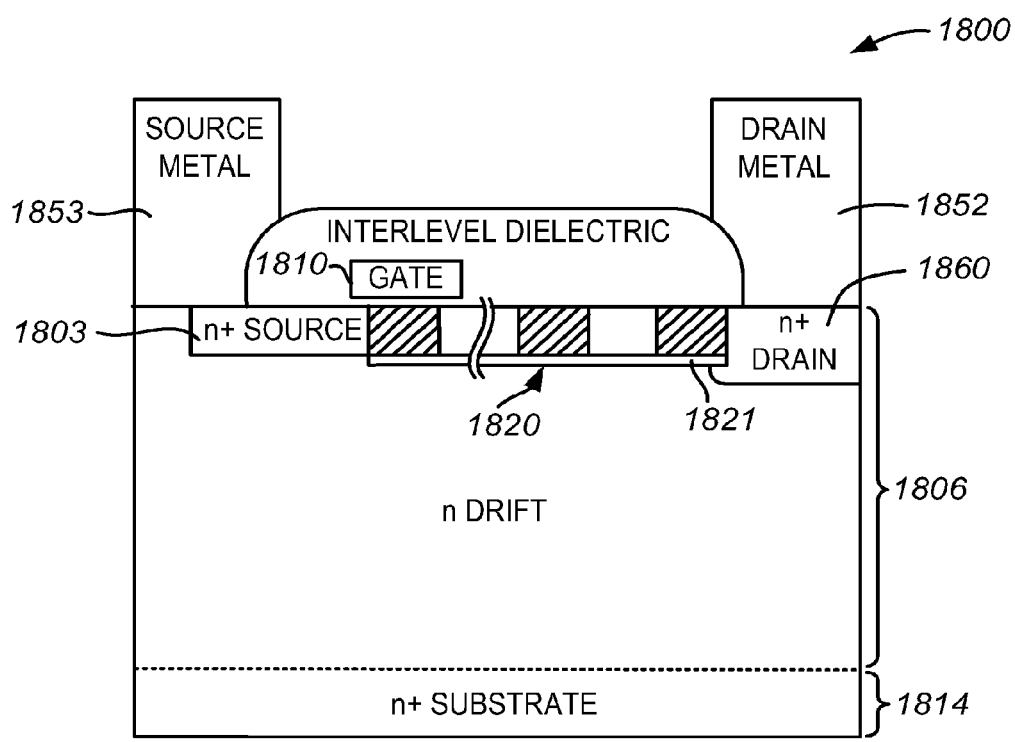
FIG. 18A shows a cross section view of an exemplary planar-gate accumulation-mode lateral field effect transistor with trenched diodes in accordance with another embodiment of the invention.
Figure 18B:
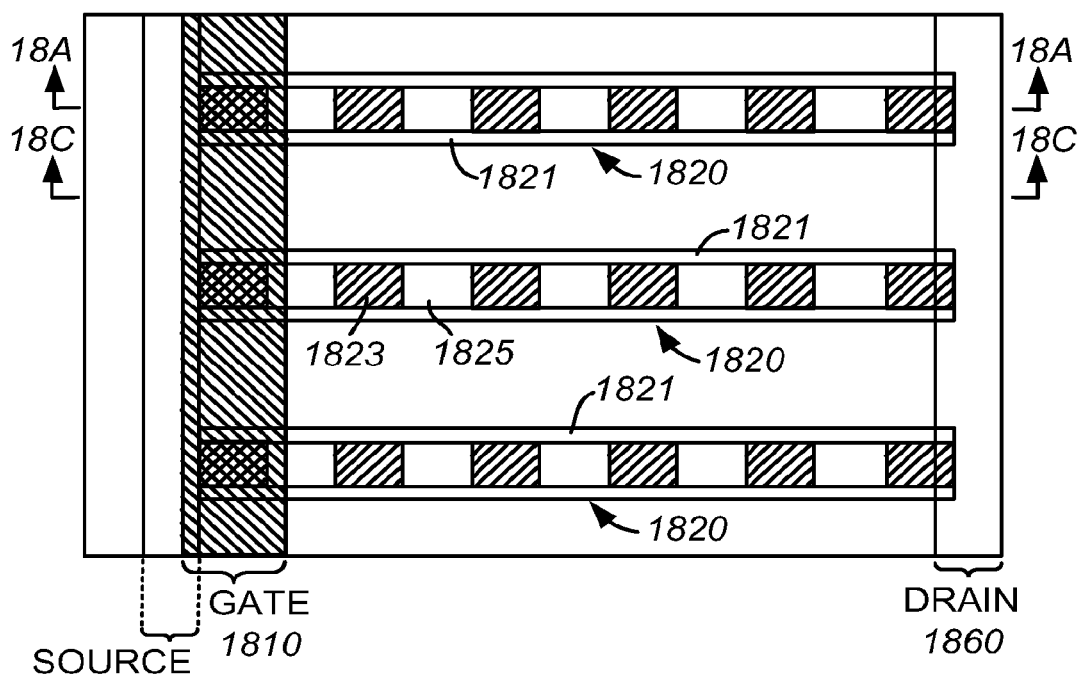
FIG. 18B shows a top layout view of the embodiment shown in FIG. 18A.
Figure 18C:
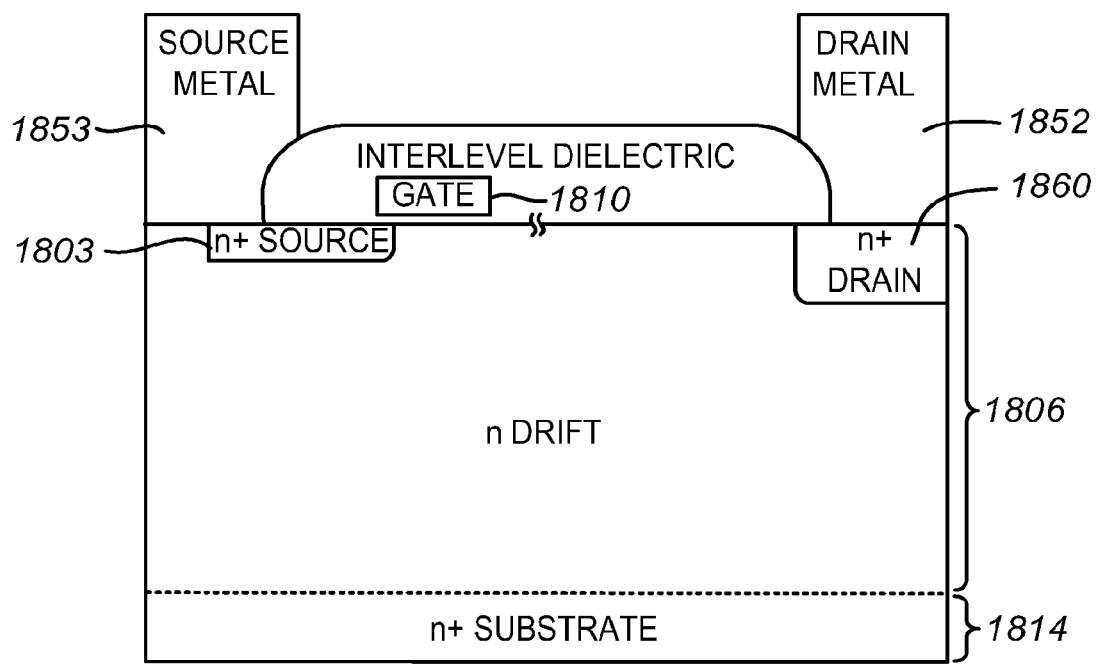
FIG. 18C shows a cross section view along 18C-18C line in FIG. 18B.

Also, variations on exemplary vertical MOS-gated accumulation transistors have been discussed to illustrate the various features and advantages of the present invention. One of skill in the art appreciates that these can be implemented in other types of devices including planar-gate vertical transistors, planar-gate lateral transistors, trenched-gate lateral transistors, diodes, bipolar transistors and the like. FIGS. 17 and 18A-18C show few examples of such devices. In FIG. 17, laterally-positioned electrodes 1711a and 1711b are integrated in a planar-gate accumulation-mode lateral transistor 1700. In FIGS. 18A-18C, laterally-extending diode trenches 1820 are integrated in a planar-gate accumulation-mode lateral transistor 1800. FIG. 18B shows a top view of transistor 1800. FIGS. 18A and 18C respectively show the cross section views along lines 18A-18A and 18C-18C in FIG. 18B. In the FIGS. 17 and 18A-18C embodiments, as in the previous embodiment, the charge balance electrodes and diodes extend parallel to the current flow.

Figure 19:
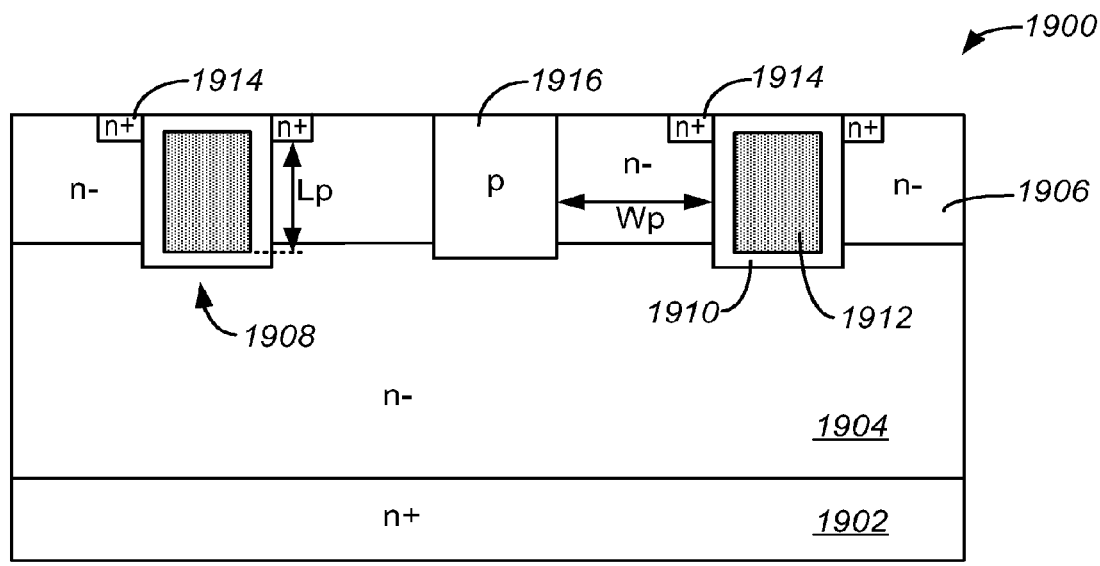
FIG. 19 shows a cross-section view of a trenched-gate accumulation FET in accordance with an embodiment of the present invention.

FIG. 19 shows a cross-section view of a trenched-gate accumulation FET 1900 in accordance with an embodiment of the present invention. FET 1900 includes an n-type substrate 1902, an n-type drift region 1904, and an n-type mesa region 1906. Gate trenches 1908 extend through mesa region 1906 and terminate in drift region 1904. Each gate trench 1908 is lined with a dielectric layer 1910 along its sidewalls and bottom, and includes a recessed gate 1912. N-type source regions 1914 flank each side of trenches 1908 as shown.

A p-type body region 1916 extends into mesa region 1906 between each pair of gate trenches 1908. Body regions 1916 form a p-n junction with mesa region 1906. The p-n junction results in a stronger pinch-off for improved blocking and Rdson. The amount of pinch-off, determined by the voltage and charge in the pinched-off region, influences the blocking characteristics. Also, the ratio of the pinched channel length (Lp in FIG. 19) to the pinched channel width (Wp in FIG. 19) needs to be kept as high as possible (preferably >1) for good blocking capability. Note that the pinched channel length Lp is the spacing between the bottom of region 1914 and the bottom of the shallower one of the gate 1912 and body region 1916.

Figure 23:
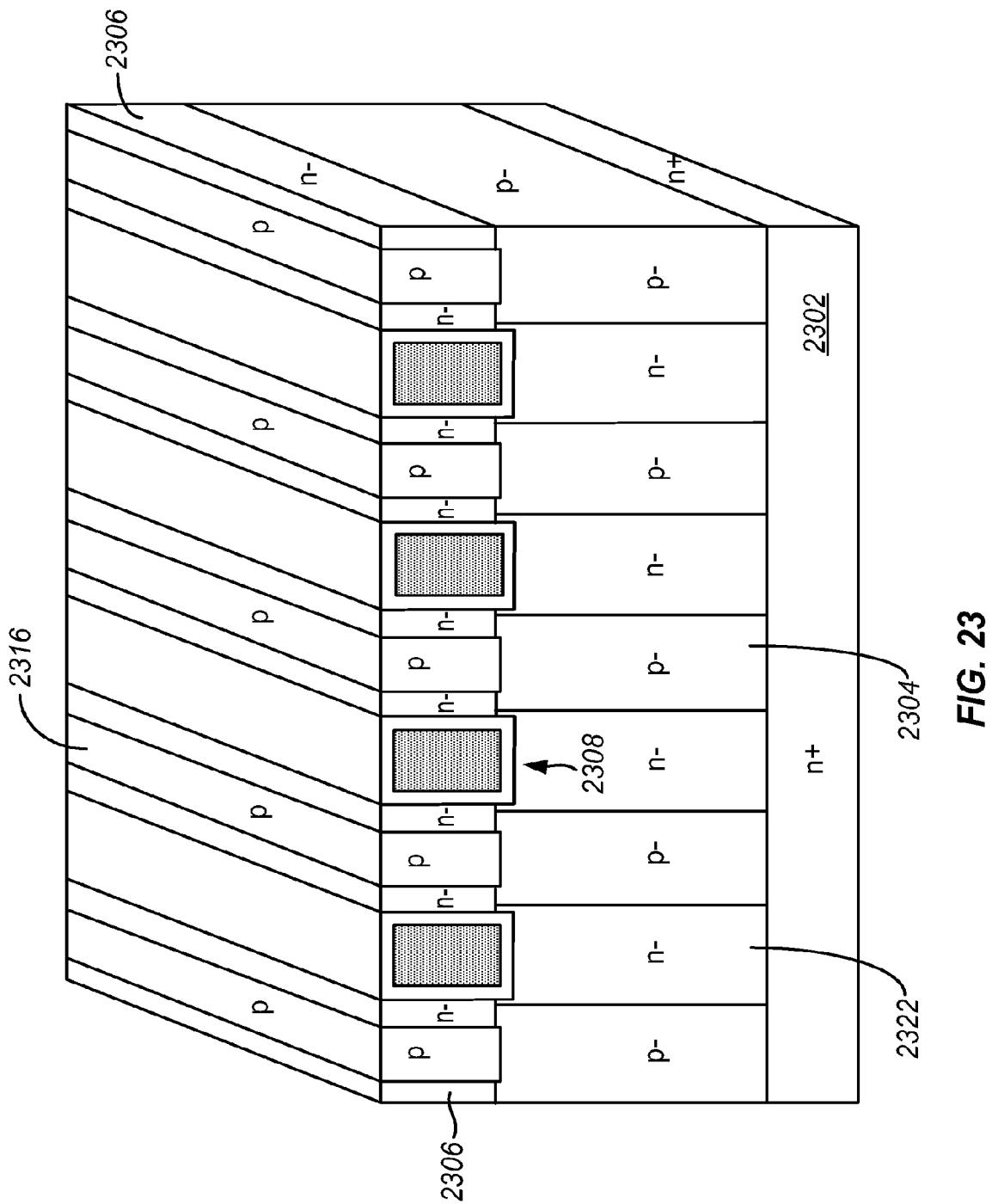
FIG. 23 shows an isometric view of a FET with charge balance structure wherein continuous stripes of body regions are used, in accordance with another embodiment of the invention.

In FIG. 19, body regions 1916 extend deeper than mesa region 1906, however, in another embodiment, a shallower body region (extending to a shallow depth within region 1906 or to a depth just above the lower surface of mesa region 1906) may be formed. But, a deeper body region, as shown, is advantageous since the built-in potential of the p-n junction (Vbi,max value is Eg/q, ~1.1V) also pinches the channel thus resulting in better blocking capability. In other embodiments, each body region 1916 is advantageously formed as a continuous stripe along the dimension perpendicular to the page. Using a continuous stripe, as opposed to multiple body regions with gaps therebetween, prevents the possibility of leakage current to flow through the gaps. FIG. 23 more clearly illustrates an implementation of continuous body regions 2316 in one embodiment of the invention. In an alternate variation, the continuous body region is broken up into multiple regions, however the gaps between the body regions needs to be kept small enough so that the gaps can be fully depleted by the built-in potential. For cellular designs, each body region 1916 (FIG. 19) is enclosed within the cell such that it helps in pinching off the entire channel.

Incorporation of the body regions in the accumulation FET, in accordance with the different embodiments of the invention, results in a net built-in voltage which is about four times greater than that without the body regions. Hence the charge (Q) in the channel can be kept higher to obtain better on-resistance with high blocking capability. Since the accumulation layer mobility is higher than inversion layer mobility, the channel resistance is lower for accumulation FETs. This is particularly true for silicon carbide (SiC) based devices. Also, the pinched regions (i.e., the portions of mesa region 1906 between body region 1916 and its adjacent gate trenches 1908) can carry current, particularly at higher current densities, in parallel to the channel regions. This further lowers the Rdson thus improving device power handling capability and its efficiency. Also, due to higher transconductance and lower Vth, the accumulation FET in accordance with the invention is particularly attractive for low gate voltage, high current applications.

Conventional accumulation FETs rely solely on MOS depletion and hence are sensitive to oxide charge variations and work function differences. However, in the accumulation FET of the present invention, majority of the blocking is provided by the p-n junction, and thus the FET device is less sensitive to oxide charges. The threshold voltage (Vth) of the accumulation FET is primarily controlled by Wp (FIG. 19) and the doping concentration of mesa region 1906. In contrast, for conventional enhancement mode FETs, Vth is controlled by the Tox, Qox, p-well dose/drive, source junction depth (Xjs), and p-well junction depth (Xjw). Therefore, the Vth of accumulation FET of the present invention could be better controlled, particularly for low Vth devices.

Figure 20:
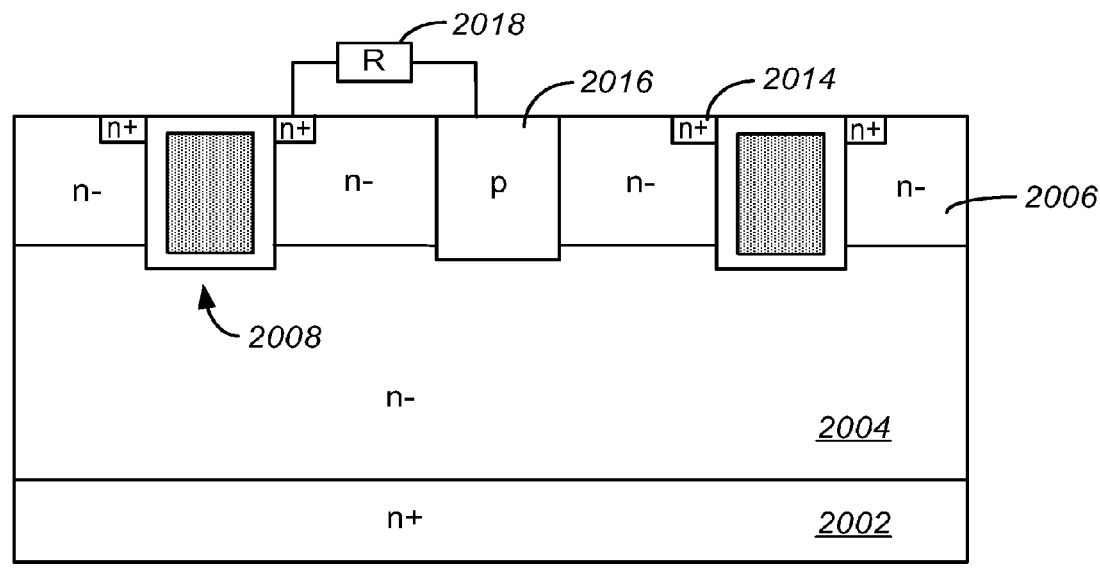
FIG. 20 shows a variation of the FIG. 19 FET wherein a resistor 2718 is coupled between the body and source regions.
Figure 21:
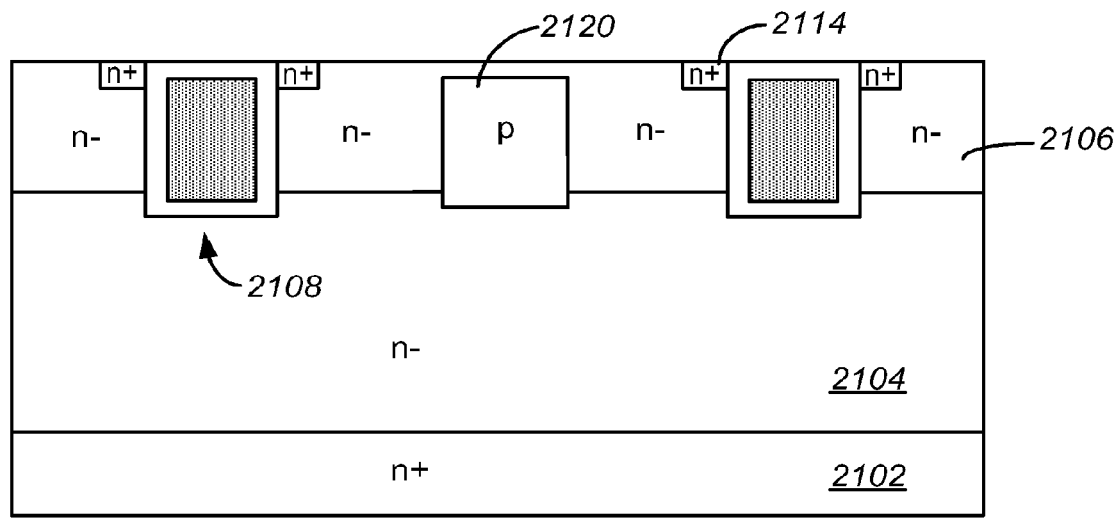
FIG. 21 show yet another variation of the FIG. 19 FET wherein the body regions are buried in silicon.

The p-n diode formed between body region 1916 and mesa region 1906 injects minority carriers when forward biased and thus the associated reverse recovery may be undesirable in certain applications. This undesirable effect can be eliminated or substantially minimized in a number of ways. In a first approach, the doping concentration of body region 1916 is reduced. In a second approach illustrated in FIG. 20, a resistor 2018 is coupled between body regions 2016 and source regions 2014. Resistor 2018 drastically reduces the diode current, but still keeps body regions 2016 at ground potential during normal operation. The capacitance associated with the p-n junction needs to be charged through resistor 2018 during switching from on to off state. Thus, the resistance value of resistor 2018 should be carefully chosen such that the switching is not adversely affected while the injection of minority carriers is minimized. A third approach is to float body regions 2016 either by not biasing them to any potential, or as illustrated in FIG. 21, burying them in silicon. The latter approach completely eliminates the body diode problem.

Figure 22:
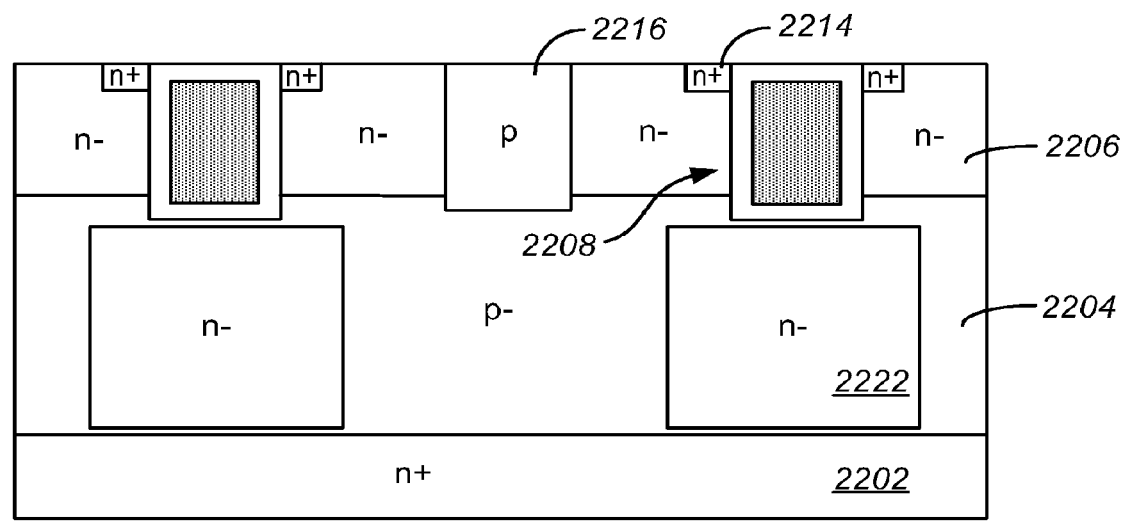
FIG. 22 shows an exemplary implementation of the FIG. 19 FET in a multi-pillar charge balance structure.

FIG. 22 shows an exemplary implementation of an embodiment of the invention in a multi-pillar charge balance structure. In general, integrating super junction structures, such as that in FIG. 22, reduces the Rdson drastically. FIG. 23 shows an isometric view of an exemplary stripe geometry device with continuous body stripes 2316 and multi-pillar charge balance structure.

The table below compares simulation results for a 30V accumulation mode FET in accordance with an embodiment of the invention and a 30V conventional enhancement mode FET. No charge balance structure was used in either device. Simulation parameters used include: trench width=mesa width=0.5 μm; Tox=250 Å; trench depth=1 μm; p-well/p-body depth=0.8 μm; Epi thickness=2 μm; Epi doping=2×$10^{16}$/cm$^3$; doping of mesa region =1×$10^{13}$/cm$^3$; BV is measured at J=1 mA/cm$^2$; Rdson at Vg=5V, J=100 A/cm$^2$; Vth at J=10 mA/cm$^2$; and Qgt at Vg=5V.

|  | Rsp; @Vg = 5 V, 100 A/cm$^2$ (μΩ-cm$^2$) | Vth @10 mA/cm$^2$ (V) | BV @1 mA/cm$^2$ (V) | Body diode Irrm (A) | Gm @Vdd = 2 V, J = 100 A/cm$^2$ (S/cm$^2$) | Qgtot @5 V (nC/cm$^2$) |
|---|---|---|---|---|---|---|
| Accumulation FET | 47.2 | 0.74 | 32.2 | 1.4 | 2427 | 1620 |
| Enhancement FET | 51.1 | 0.74 | 34.7 | 3.7 | 1676 | 1811 |

As can be seen, the accumulation FET has lower Rsp, Qg and Irrm, and a much higher transconductance (Gm) than the conventional enhancement FET. Also, simulation results showed that the electric field lines in the drift region of the accumulation FET had little crowding, were equally spaced and substantially flat, and as such similar blocking capability as the conventional FET was obtained.

Known process techniques can be used to form the accumulation FET of the present invention. For example, the manufacturing methods described above may be used and modified in one of a number of ways to obtain the structures shown in FIGS. 19-23. Body regions 1916 (FIG. 19) can be formed in a number of ways. In a first approach, multiple implants of p-type dopants into mesa region 1906 are carried out using varying energies to form body regions 1916 with a relatively uniform doping concentration and a rectangular profile with minimal lateral bulge. In a second approach, a trench may be formed through mesa regions 1906 between adjacent gate trenches 1908, and then selectively filled with p-type silicon using well know selective epitaxial growth (SEG) techniques. The latter approach provides good aspect ratio with a rectangular shape, and uniform doping concentration. These two techniques can be modified, as known in this art, to form the buried body regions 2120 in FIG. 21. Resistor 2018 in FIG. 20 may be formed in a number of ways. For example, a polysilicon thin film resistor may be used or alternatively the high metal contact resistance to lightly doped p-type body may be used as the resistor.

FIGS. 19-23 show the gate trenches terminating in the drift region, however, the gate trenches can also extend through the drift region and terminate within the substrate. While FIG. 23 shows an open cell geometry, the various embodiments of the invention may be implemented in any closed cell geometry, including hexagonal and square shape geometries. Also, while the various embodiments illustrated in FIGS. 19-23 are implemented in conventional silicon, these embodiments and their obvious variants can also be implemented in silicon carbide, gallium arsenide, gallium nitride, diamond or other semiconductor materials.

The cross-section views of the various embodiments described herein may not be to scale, and as such are not intended to limit the possible variations in the layout design of the corresponding structures. Also, the various transistors can be formed in stripe or cellular architecture including hexagonal or square shaped transistor cells Although a number of specific embodiments are shown and described above, embodiments of the invention are not limited thereto. For example, it is understood that the doping polarities of the structures shown and described could be reversed and/or the doping concentrations of the various elements could be altered without departing from the invention. As another example, the various exemplary accumulation-mode vertical transistors described above have the trenches terminating in the drift regions, but they can also terminate in the more heavily doped substrate. As yet another example, the above-described embodiments are formed in silicon, but they could also be formed in silicon carbide, GaAs or other types of semiconductor materials. Also, the features of one or more embodiments of the invention may be combined with one or more features of other embodiments of the invention without departing from the scope of the invention.

Therefore, the scope of the present invention should be determined not with reference to the above description but should, instead, be determined with reference to the appended claim, along with their full scope of equivalents.

What is claimed is:

1. A method of forming an accumulation-mode field effect transistor, the method comprising:
    forming a channel region of a first conductivity type in a semiconductor region of the first conductivity type, the channel region extending from a top surface of the semiconductor region to a first depth within the semiconductor region;
    forming a gate trench in the semiconductor region, the gate trench extending from the top surface of the semiconductor region to a second depth within the semiconductor region below the first depth; and
    forming a silicon region of a second conductivity type in the semiconductor region and extending to a third depth of at least the second depth such that the silicon region forms a P-N junction with the channel region along a wall of the silicon region.

2. The method of claim 1 wherein the silicon region and the gate trench are arranged so that the silicon region is laterally spaced from the gate trench.

3. The method of claim 1 wherein a conduction channel is formed in the channel region along a sidewall of the gate trench when the accumulation-mode field effect transistor is in an on state.

4. The method of claim 1 wherein the forming the silicon region includes:
    forming a body trench in the semiconductor region, the body trench extending from the top surface of the semiconductor region to the third depth within the semiconductor region below the second depth; and
    substantially filling the body trench with silicon material of the second conductivity type.

5. The method of claim 1 wherein the silicon region is formed by implanting a dopant of the second conductivity type into the semiconductor region.

6. The method of claim 1 further comprising:
    forming a gate electrode in the gate trench, the gate electrode being adjacent to but insulated from the channel region.

7. The method of claim 1 wherein the semiconductor region includes an epitaxial layer extending over and in contact with a substrate, the substrate and the epitaxial layer being of the first conductivity type, the epitaxial layer having a lower doping concentration than the substrate, and
    the channel region, the gate trench, and the silicon region extending into the epitaxial layer.

8. The method of claim 1 further comprising:
    forming a source region of the first conductivity type in the channel region such that the source region flanks a side of the gate trench, the source region having a higher doping concentration than a doping concentration of the channel region.

9. The method of claim 8 further comprising:
    forming a resistor coupled between the silicon region and the source region.

10. The method of claim 1 wherein a plurality of gate trenches including the gate trench and a plurality of silicon regions including the silicon region are disposed in parallel-extending continuous stripes.

11. The method of claim 1 wherein the silicon region is formed in the semiconductor region such that a top surface of the silicon region is below the top surface of the semiconductor region.

12. The method of claim 1 further comprising:
    forming a column of silicon of the second conductivity type in the semiconductor region of the first conductivity type so that the column of silicon of the second conductivity type and the semiconductor region of the first conductivity type together form at least part of alternating columns of first and second conductivity type silicon, substantially no current flows through the columns of silicon of the second conductivity type when the accumulation-mode field effect transistor is in an on state.

13. The method of claim 12 wherein the column of silicon of the second conductivity type extends directly below a corresponding silicon region of the second conductivity type.

14. The method of claim 1 wherein the forming the silicon region of the second conductivity type includes forming the silicon region of the second conductivity type having a top surface that is coplanar with the top surface of the semiconductor region of the first conductivity type.

* * * * *